United States Patent
Sasai et al.

(10) Patent No.: US 10,075,706 B2
(45) Date of Patent: Sep. 11, 2018

(54) IMAGE CODING METHOD, IMAGE DECODING METHOD, IMAGE CODING APPARATUS, IMAGE DECODING APPARATUS, AND IMAGE CODING AND DECODING APPARATUS

(75) Inventors: Hisao Sasai, Osaka (JP); Takahiro Nishi, Nara (JP); Youji Shibahara, Osaka (JP); Toshiyasu Sugio, Osaka (JP)

(73) Assignee: SUN PATENT TRUST, New York, NY (US)

( * ) Notice: Subject to any disclaimer, the term of this patent is extended or adjusted under 35 U.S.C. 154(b) by 766 days.

(21) Appl. No.: 13/976,637

(22) PCT Filed: Jan. 18, 2012

(86) PCT No.: PCT/JP2012/000265
§ 371 (c)(1),
(2), (4) Date: Jun. 27, 2013

(87) PCT Pub. No.: WO2012/098868
PCT Pub. Date: Jul. 26, 2012

(65) Prior Publication Data
US 2013/0272427 A1    Oct. 17, 2013

Related U.S. Application Data

(60) Provisional application No. 61/434,015, filed on Jan. 19, 2011.

(51) Int. Cl.
*H04N 19/167* (2014.01)
*H04N 19/18* (2014.01)
(Continued)

(52) U.S. Cl.
CPC .... *H04N 19/00254* (2013.01); *H03M 7/4018* (2013.01); *H04N 19/13* (2014.11); *H04N 19/167* (2014.11); *H04N 19/18* (2014.11)

(58) Field of Classification Search
None
See application file for complete search history.

(56) References Cited

U.S. PATENT DOCUMENTS 7,251,371 B2 *  7/2007  Kobayashi et al. ........... 382/239
7,496,143 B2 *  2/2009  Schwarz et al. ......... 375/240.18
(Continued)

FOREIGN PATENT DOCUMENTS

| JP | 2005-530375 | 10/2005 |
| WO | 03/043346 | 5/2003 |
| WO | 03/094529 | 11/2003 |

OTHER PUBLICATIONS

International Search Report dated Apr. 24, 2012 in corresponding International Application No. PCT/JP2012/000265.
(Continued)

*Primary Examiner* — Reza Aghevli
(74) *Attorney, Agent, or Firm* — Wenderoth, Lind & Ponack, L.L.P.

(57) ABSTRACT

An image coding method for coding image data on a block-by-block basis includes: segmenting a block including coefficients of frequency components, into groups corresponding to frequency ranges based on types of the coefficients, and determining a context corresponding to each of the groups; performing, for each of the coefficients, binary arithmetic coding on the coefficient according to a probability information item corresponding to the context, the context being corresponding to the group having the coefficient; and updating, for each of probability information items, the probability information item corresponding to the context, based on the coefficient included in the group corresponding to the context, wherein in the segmenting, the block is segmented into the groups with various numbers of coefficients.

5 Claims, 36 Drawing Sheets

(51) Int. Cl.
*H04N 19/13* (2014.01)
*H04N 19/00* (2014.01)
*H04N 19/169* (2014.01)
*H03M 7/40* (2006.01)

(56) References Cited

U.S. PATENT DOCUMENTS

| | | | |
|---|---|---|---|
| 7,702,013 B2* | 4/2010 | Schwarz et al. | 375/240.02 |
| 2004/0114683 A1 | 6/2004 | Schwarz et al. | |
| 2004/0131272 A1 | 7/2004 | Kobayashi et al. | |
| 2007/0237240 A1* | 10/2007 | Lee et al. | 375/240.24 |
| 2009/0097568 A1* | 4/2009 | Karczewicz et al. | 375/240.24 |
| 2009/0175332 A1* | 7/2009 | Karczewicz et al. | 375/240.03 |

OTHER PUBLICATIONS

ISO/IEC 14496-10 "MPEG-4 Part10 Advanced Video Coding", Oct. 1, 2004.
Thomas Wiegand et al, "Overview of the H.264/AVC Video Coding Standard", IEEE Transactions on Circuits and Systems for Video Technology, Jul. 2003, pp. 1-19.
Thomas Wiegand et al., "WD1: Working Draft 1 of High-Efficiency Video Coding", Joint Collaborative Team on Video Coding (JCT-VC) of ITU-T SG16 WP3 and ISO/IEC JTC1/SC29/WG11, JCTVC-C403, Ver. 1, 3rd Meeting: Guangzhou, CN, Oct. 7-15, 2010.

* cited by examiner

FIG. 4

| Index ctxIdx | Occurrence probability pStateIdx | Symbol valMPS |
|---|---|---|
| 0 | 12 | 1 |
| 1 | 7 | 0 |
| 2 | 41 | 0 |
| 3 | 22 | 1 |
| 4 | 10 | 1 |
| 5 | 8 | 0 |
| 6 | 50 | 1 |
| : | : | : |

| | First group | | | Second group | | | | | |
|---|---|---|---|---|---|---|---|---|---|
| SE | 0 | 1 | 2 | 3 | 4 | 5 | 6 | 7 | ... |
| ctxIdx | 0 | 0 | 0 | 1 | 1 | 1 | 1 | 1 | ... |

(b)

| | Fourth group | | | | | | | | |
|---|---|---|---|---|---|---|---|---|---|
| SE | 20 | 21 | 22 | 23 | 24 | 25 | 26 | 27 | ... |
| ctxIdx | 3 | 3 | 3 | 3 | 3 | 3 | 3 | 3 | ... |

(c)

Coded as mapping info / Stored in memory

| 4x4mapIdx | 4x4 mapping info | | | | | | | | | | | | | | | | |
|---|---|---|---|---|---|---|---|---|---|---|---|---|---|---|---|---|---|
| 0 | SE | 0 | 1 | 2 | 3 | 4 | 5 | 6 | 7 | 8 | 9 | 10 | 11 | 12 | 13 | 14 | 15 |
| 0 | ctxIdx | 0 | 1 | 2 | | | | | | | | 3 | | | | | |
| 1 | SE | 0 | 1 | 2 | 3 | 4 | 5 | 6 | 7 | 8 | 9 | 10 | 11 | 12 | 13 | 14 | 15 |
| 1 | ctxIdx | 0 | | | 1 | | | 2 | | | | | | | | | |
| 2 | SE | 0 | 1 | 2 | 3 | 4 | 5 | 6 | 7 | 8 | 9 | 10 | 11 | 12 | 13 | 14 | 15 |
| 2 | ctxIdx | 0 | | | | 1 | | | | | | | | | | | |
| k | SE | 0 | 1 | 2 | 3 | 4 | 5 | 6 | 7 | 8 | 9 | 10 | 11 | 12 | 13 | 14 | 15 |
| k | ctxIdx | 0 | 1 | | | | | | | | | | | | | | |
| n | SE | 0 | 1 | 2 | 3 | 4 | 5 | 6 | 7 | 8 | 9 | 10 | 11 | 12 | 13 | 14 | 15 |
| n | ctxIdx | 0 | 1 | 2 | 3 | 4 | 5 | 6 | 7 | 8 | 9 | 10 | 11 | 12 | 13 | 14 | 15 |

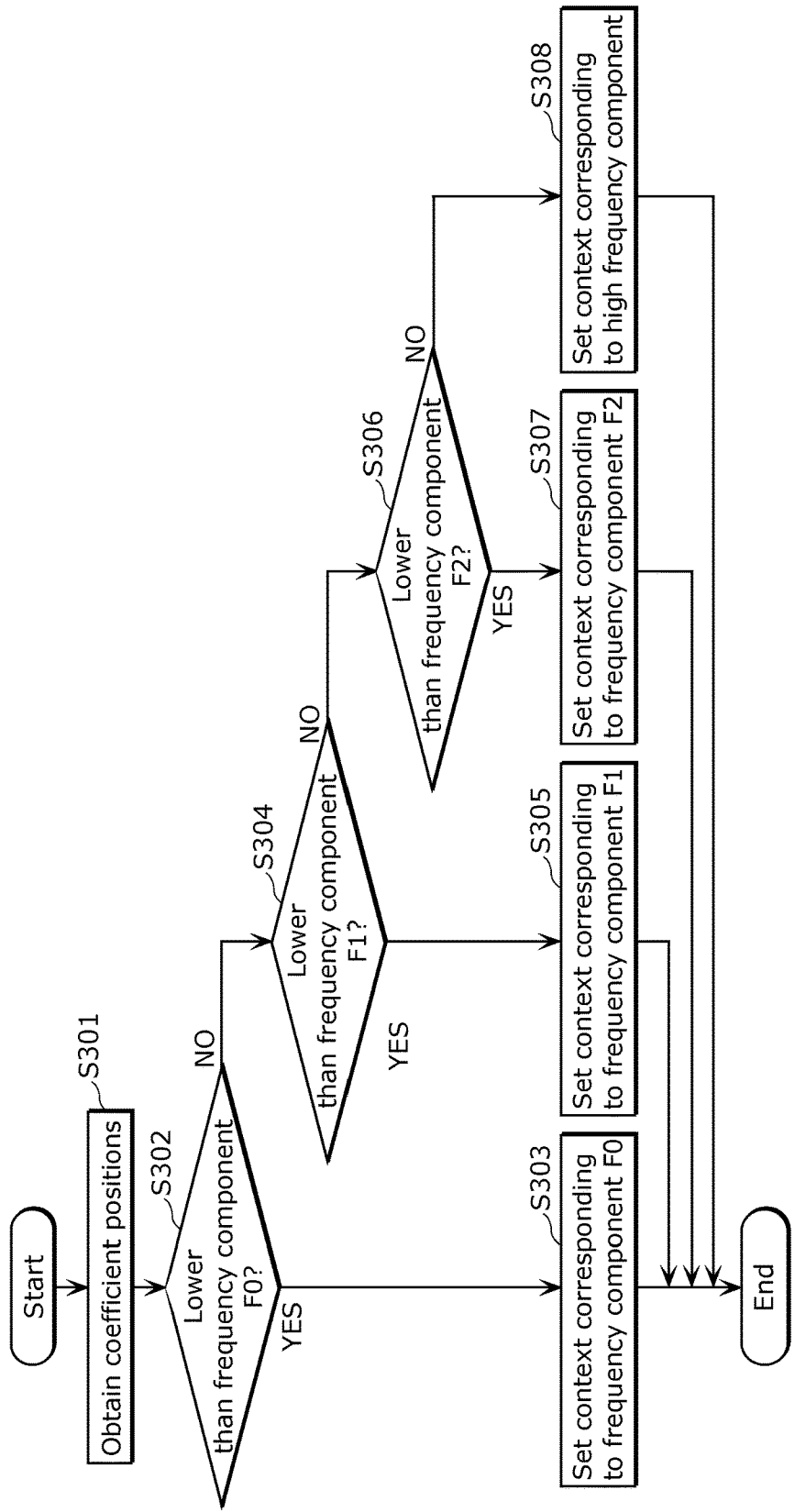

FIG. 23
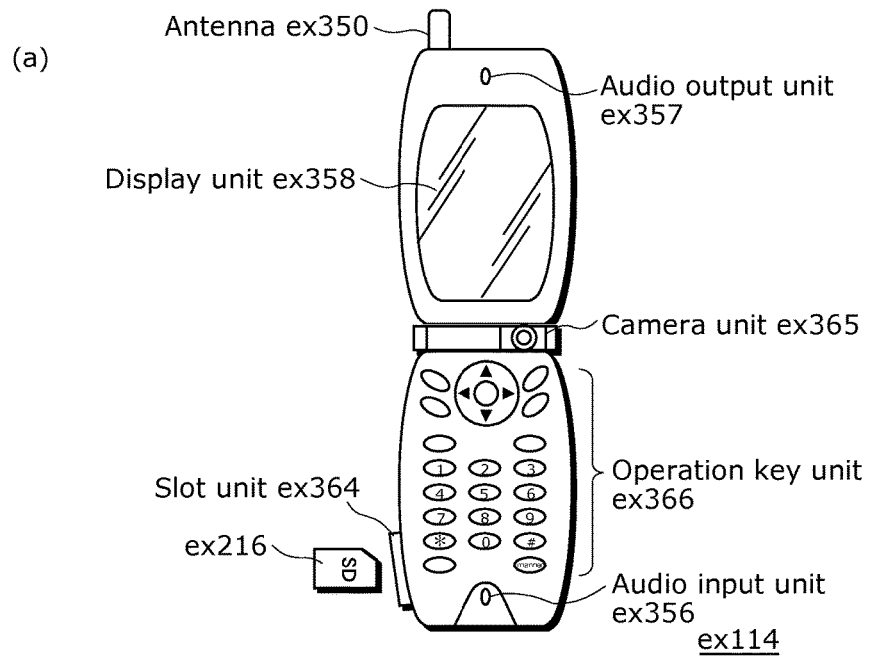
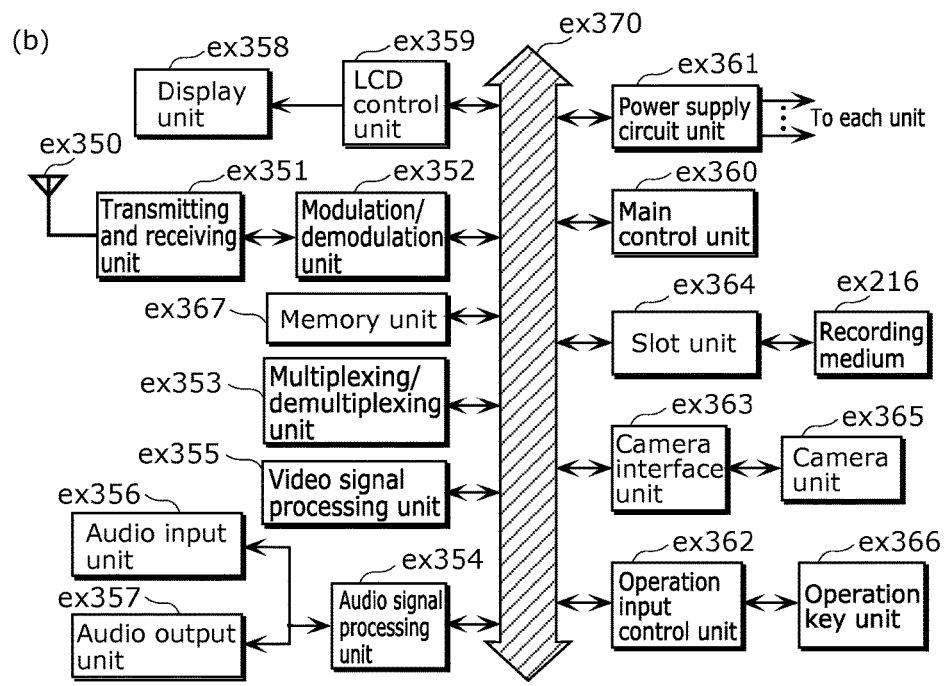

FIG. 24

| |
|---|
| Video stream (PID=0x1011, Primary video) |
| Audio stream (PID=0x1100) |
| Audio stream (PID=0x1101) |
| Presentation graphics stream (PID=0x1200) |
| Presentation graphics stream (PID=0x1201) |
| Interactive graphics stream (PID=0x1400) |
| Video stream (PID=0x1B00, Secondary video) |
| Video stream (PID=0x1B01, Secondary video) |

Data structure of PMT

FIG. 35

| Corresponding standard | Driving frequency |
|---|---|
| MPEG-4 AVC | 500 MHz |
| MPEG-2 | 350 MHz |
| ⋮ | ⋮ |

FIG. 36
(a)
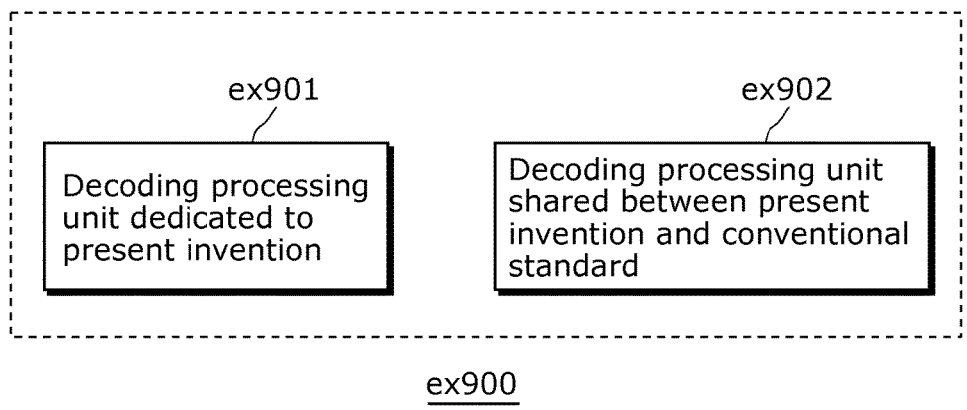
(b)
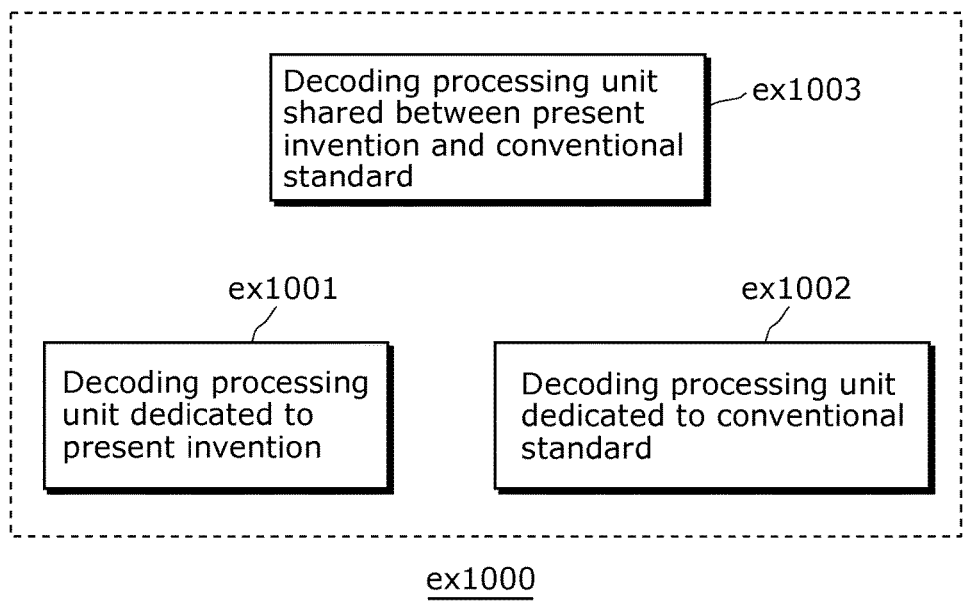

IMAGE CODING METHOD, IMAGE DECODING METHOD, IMAGE CODING APPARATUS, IMAGE DECODING APPARATUS, AND IMAGE CODING AND DECODING APPARATUS

This application is the national stage of International Application PCT/JP2012/000265, filed Jan. 18, 2012, which claims the benefit of U.S. Provisional Application No. 61/434,015, filed Jan. 19, 2011.

TECHNICAL FIELD

The present invention relates to image coding methods, image decoding methods, image coding apparatuses, image decoding apparatuses, and image coding and decoding apparatuses, and particularly relates to an image coding method, an image decoding method, an image coding apparatus, an image decoding apparatus, and an image coding and decoding apparatus in each of which one or both of arithmetic coding and arithmetic decoding is or are performed.

BACKGROUND ART

A plurality of video coding standards have been developed for compressing video data. Such video coding standards include, for example, the ITU-T standards denoted as H.26x, produced by the telecommunication standardization sector of the International Telecommunication Union, and the ISO/IEC standards denoted as MPEG-x. The most up-to-date and advanced video coding standard is currently the standard denoted as H.264/AVC or MPEG-4 AVC (see Non-Patent Literature 1 and Non-Patent Literature 2).

In the H.264/AVC standard, the coding process roughly includes prediction, transform, quantization, and entropy coding. Through the entropy coding, redundant information is cut from information which is used in the prediction, quantized information, and the like. The known examples of the entropy coding include variable-length coding, adaptive coding, and fixed-length coding. The variable-length coding includes Huffman coding, run-length coding, and arithmetic coding.

Of these, the arithmetic coding is a method in which the probability of occurrence of a symbol is calculated to determine an output code. In other words, arithmetic coding is performed on image data using a symbol occurrence probability for each context corresponding to characteristics of image data, while a symbol occurrence probability is updated for each coding. Since a code is determined according to characteristics of image data in the arithmetic coding, the arithmetic coding is known for higher coding efficiency than Huffman coding or the like which uses a fixed coding table.

CITATION LIST

Non Patent Literature

[NPL 1]
ISO/IEC 14496-10 "MPEG-4 Part 10 Advanced Video Coding"
[NPL 2]
Thomas Wiegand et al, "Overview of the H.264/AVC Video Coding Standard", IEEE TRANSACTIONS ON CIRCUITS AND SYSTEMS FOR VIDEO TECHNOLOGY, JULY 2003, PP. 1-19.

SUMMARY OF INVENTION

Technical Problem

However, there is a problem that the conventional arithmetic coding does not have a sufficient coding efficiency.

The present invention has been devised to solve the above conventional problem and an object of the present invention is to provide an image coding method, an image decoding method, an image coding apparatus, an image decoding apparatus, and an image coding and decoding apparatus in each of which coding efficiency is increased.

Solution to Problem

An image coding method according to an aspect of the present invention is a method for coding image data on a block-by-block basis. Specifically, the image coding method includes: segmenting a block including coefficients of frequency components, into groups corresponding to frequency ranges based on types of the coefficients, and determining a context corresponding to each of the groups; performing, for each of the coefficients, binary arithmetic coding on the coefficient according to a probability information item corresponding to the context, the context being corresponding to the group having the coefficient; and updating, for each of probability information items, the probability information item corresponding to the context, based on the coefficient included in the group corresponding to the context. Then, in the determining, the block is segmented into the groups with various numbers of coefficients.

As indicated by the above described configuration, the block is segmented into a plurality of groups according to types of coefficients, and binary arithmetic coding is performed according to a probability information item of context corresponding to each of the groups, with the result that coding efficiency is increased.

Moreover, in the segmenting, the block may be segmented into the groups including a first group with a DC component, with a total number of coefficients in the first group being less than or equal to a total number of the coefficients in another group.

Furthermore, in the segmenting, the block may be segmented into the groups including the first group, a second group with a highest-frequency component, and a third group between the first group and the second group, with a total number of the coefficients in the third group being greater than a total number of the coefficients in the second group.

Moreover, at least one of the coefficients may include a first flag and a second flag, the first flag indicating whether or not a corresponding quantized coefficient is zero, the second flag indicating a position of a last non-zero quantized coefficient in scan order.

An image decoding method according to an aspect of the present invention is a method for decoding image data on a block-by-block basis. Specifically, the image decoding method includes: segmenting a block including a current signal to be decoded that is part of the coded image data, into groups corresponding to a frequency component range according to a type of the current signal, and determining a context corresponding to each of the groups; performing binary arithmetic decoding on the current signal according to a probability information item corresponding to the context, to generate binarized coefficients, the context being corresponding to the group having the current signal; and updating, for each of probability information items, the probability information item corresponding to the context, based on the coefficient included in the group corresponding to the context. Then, in the segmenting, the block is segmented into the groups with various numbers of coefficients.

Moreover, in the segmenting, the block may be segmented into the groups including a first group with a DC component, with a total number of coefficients in the first group being less than or equal to a total number of the coefficients in another group.

Furthermore, in the segmenting, the block may be segmented into the groups including the first group, a second group with a highest-frequency component, and a third group between the first group and the second group, with a total number of the coefficients in the third group being greater than a total number of the coefficients in the second group.

Moreover, at least one of the coefficients includes a first flag and a second flag, the first flag indicating whether or not a corresponding quantized coefficient is zero, the second flag indicating a position of a last non-zero quantized coefficient in scan order.

An image coding apparatus according to an aspect of the present invention codes image data on a block-by-block basis. Specifically, the image coding apparatus includes: a context determination unit configured to segment a block including coefficients of frequency components, into groups corresponding to frequency ranges based on types of the coefficients, and determine a context corresponding to each of the groups; a binary arithmetic coding unit configured to perform, for each of the coefficients, binary arithmetic coding on the coefficient according to a probability information item corresponding to the context, the context being corresponding to the group having the coefficient; and an updating unit configured to update, for each of probability information items, the probability information item corresponding to the context, based on the coefficient included in the group corresponding to the context. Then, the context determination unit is configured to segment the block into the groups with various numbers of coefficients.

An image decoding apparatus according to an aspect of the present invention decodes coded image data on a block-by-block basis. Specifically, an image decoding apparatus which decodes image data on a block-by-block basis includes: a context determination unit configured to segment a block including coefficients of frequency components, into groups corresponding to frequency ranges based on types of the coefficients, and determine a context corresponding to each of the groups; a binary arithmetic decoding unit configured to perform, for each of the coefficients, binary arithmetic coding on the coefficient according to a probability information item corresponding to the context, the context being corresponding to the group having the coefficient; and an updating unit configured to update, for each of probability information items, the probability information item corresponding to the context, based on the coefficient included in the group corresponding to the context. Then, the context determination unit is configured to segment the block into the groups with various numbers of coefficients.

An image coding and decoding apparatus according to an aspect of the present invention includes an image coding apparatus which codes image data on a block-by-block basis to generate coded image data, and an image decoding apparatus which decodes the coded image data on a block-by-block basis. Specifically, the image coding apparatus includes: a first context determination unit configured to segment a block including coefficients of frequency components, into groups corresponding to frequency ranges based on types of the coefficients, and determine a context corresponding to each of the groups; a binary arithmetic coding unit configured to perform, for each of the coefficients, binary arithmetic coding on the coefficient according to a probability information item corresponding to the context, the context being corresponding to the group having the coefficient; and a first updating unit configured to update, for each of probability information items, the probability information item corresponding to the context, based on the coefficient included in the group corresponding to the context. Specifically, the image decoding apparatus includes: a second context determination unit configured to segment a block including a current signal to be decoded that is part of the coded image data, into groups corresponding to a frequency component range according to a type of the current signal, and determine a context corresponding to each of the groups; a binary arithmetic decoding unit configured to perform binary arithmetic decoding on the current signal according to a probability information item corresponding to the context, to generate binarized coefficients, the context being corresponding to the group having the current signal; and a second updating unit configured to updating, for each of probability information items, the probability information item corresponding to the context, based on the coefficient included in the group corresponding to the context. Then, the first and second context determination units are configured to segment the block into the groups with various numbers of coefficients.

Advantageous Effects of Invention

The present invention makes it possible to generate a bitstream using an appropriate context for each group and to decode it using the corresponding context also in the decoding apparatus.

BRIEF DESCRIPTION OF DRAWINGS

FIG. 4 is a diagram showing an example of a structure of a symbol occurrence probability table according to Embodiment 1 of the present invention.

FIG. 5 is a diagram showing an example of a context table (mapping information to be coded) according to Embodiment 1 of the present invention.

FIG. 8 is a flowchart showing an example of context segment control according to Embodiment 1 of the present invention.

(a) in FIG. 23 shows an example of a cellular phone, and (b) in FIG. 23 is a block diagram showing an example of a configuration of the cellular phone.

FIG. 24 illustrates a structure of the multiplexed data.

Figure 25:
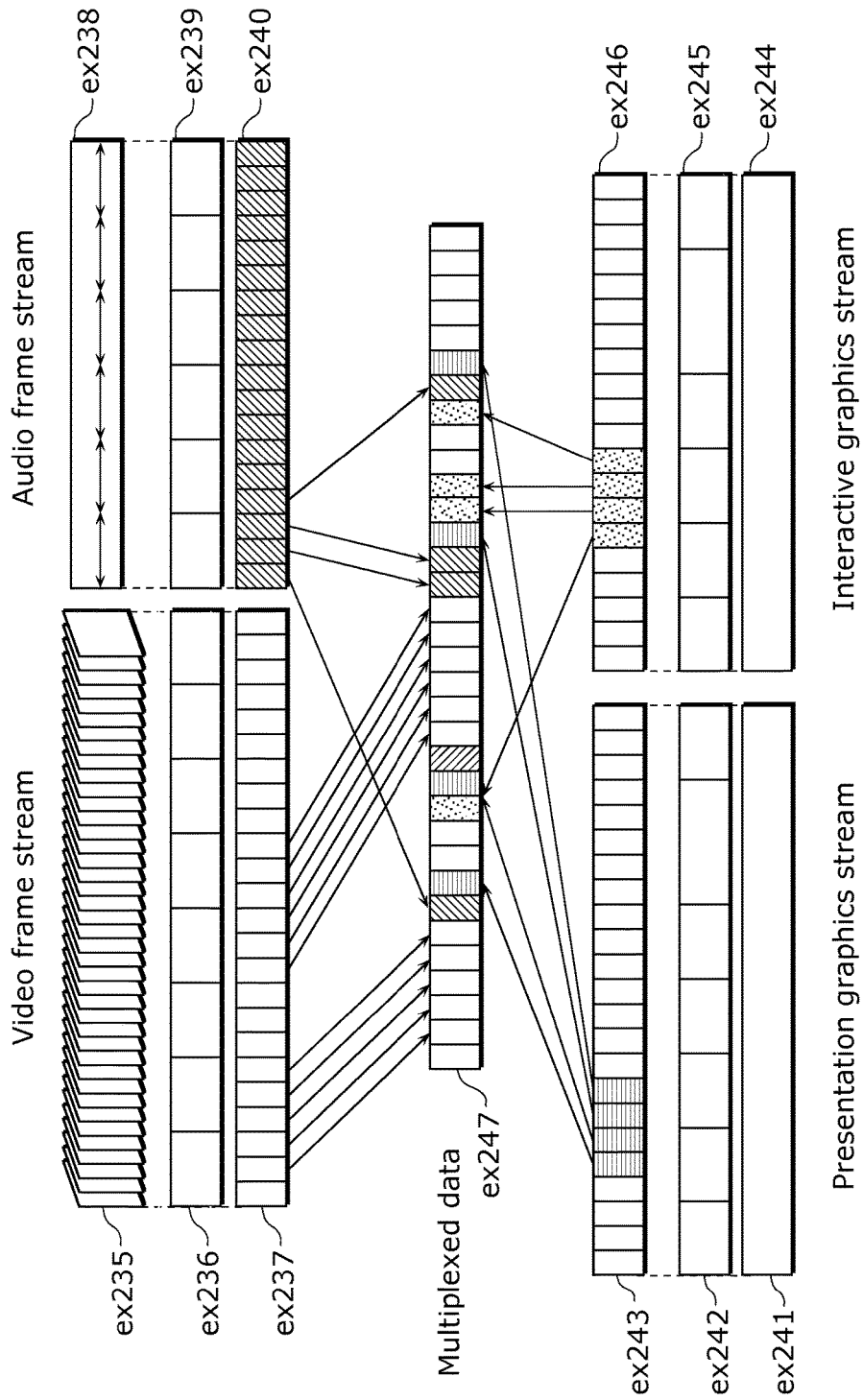

FIG. 25 schematically illustrates how each of streams is multiplexed in multiplexed data.

Figure 26:
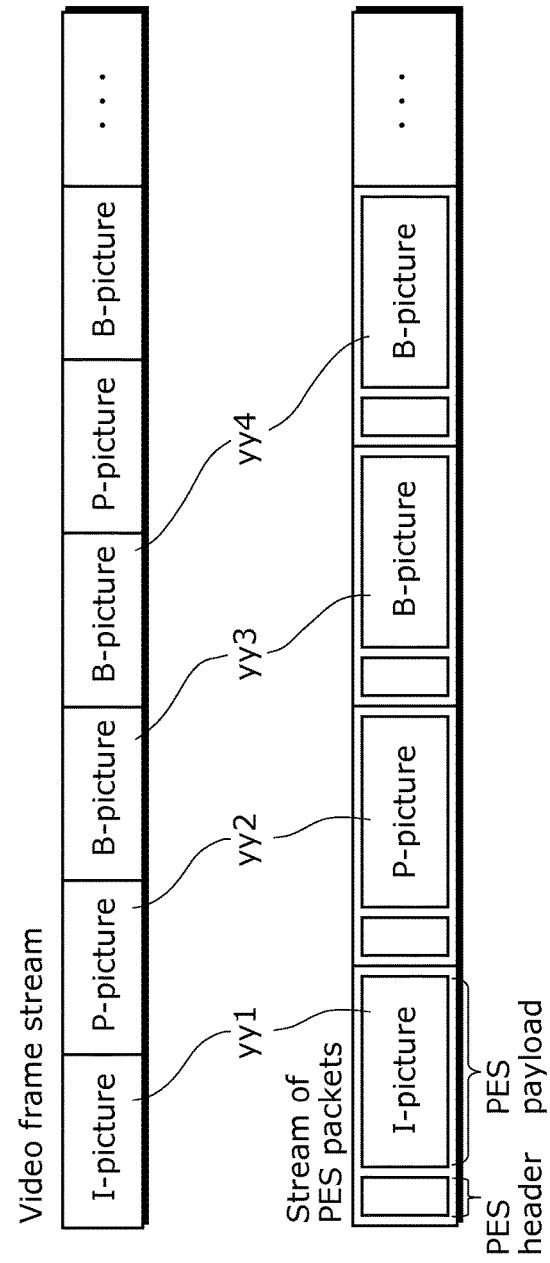

FIG. 26 illustrates how a video stream is stored in a stream of PES packets in more detail.

Figure 27:
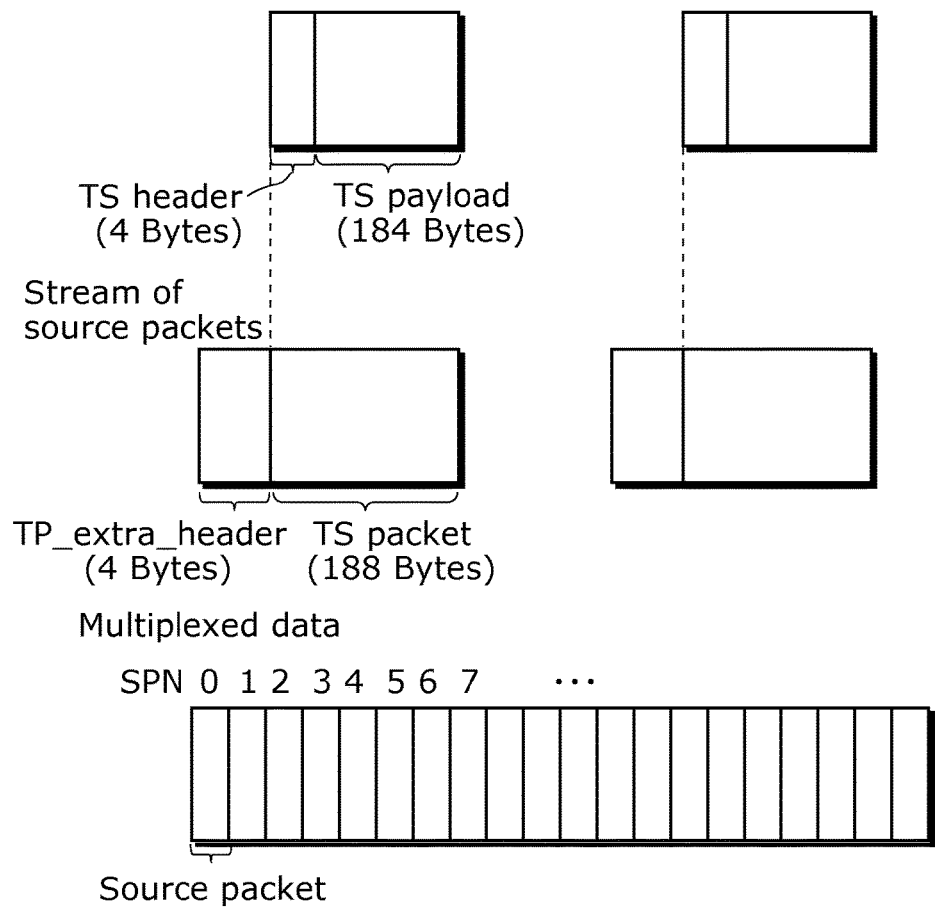

FIG. 27 shows a structure of TS packets and source packets in the multiplexed data.

Figure 28:
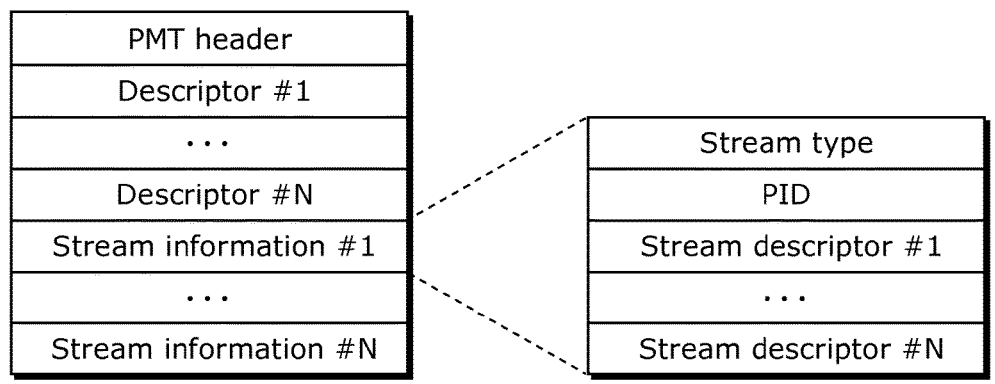

FIG. 28 shows a data structure of a PMT.

Figure 29:
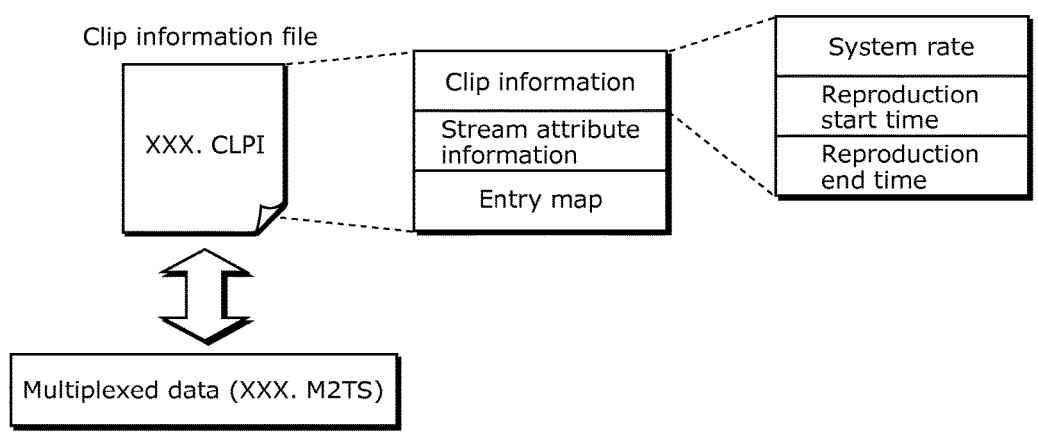

FIG. 29 illustrates an internal structure of multiplexed data information.

Figure 30:
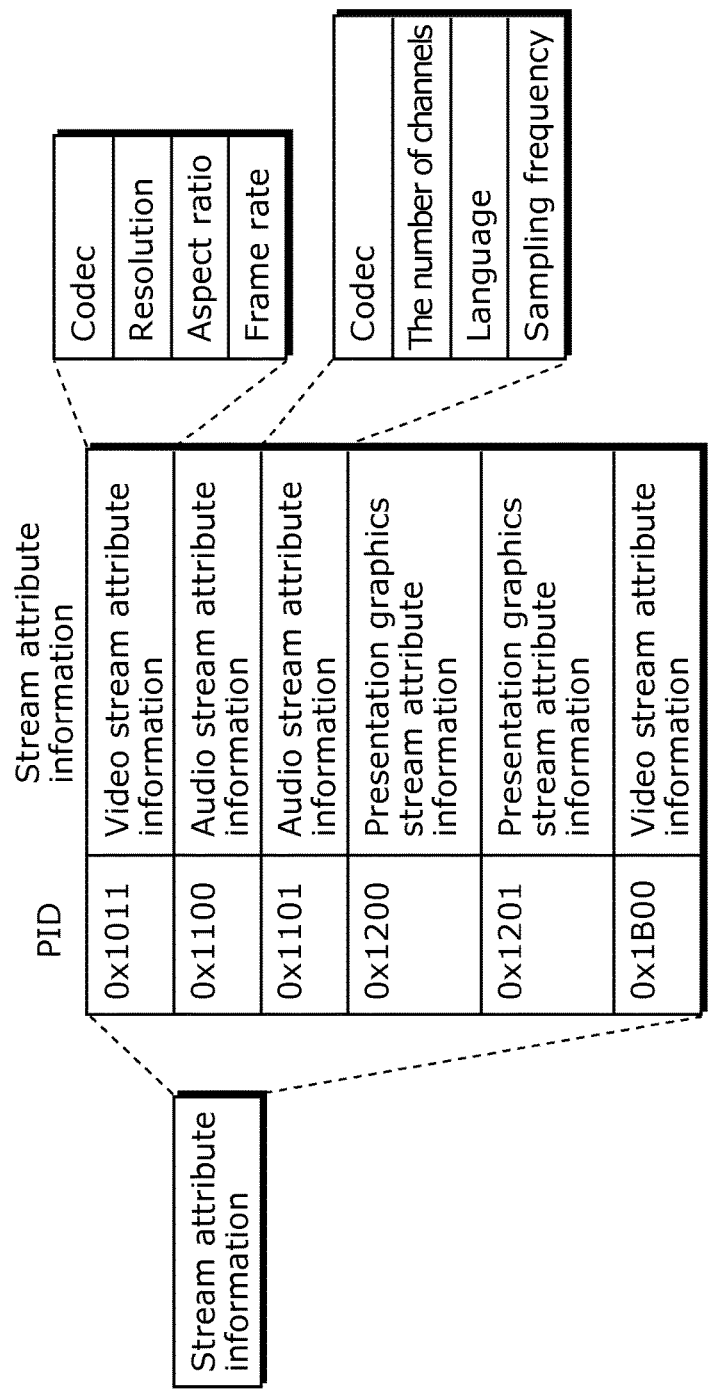

FIG. 30 shows an internal structure of stream attribute information.

Figure 31:
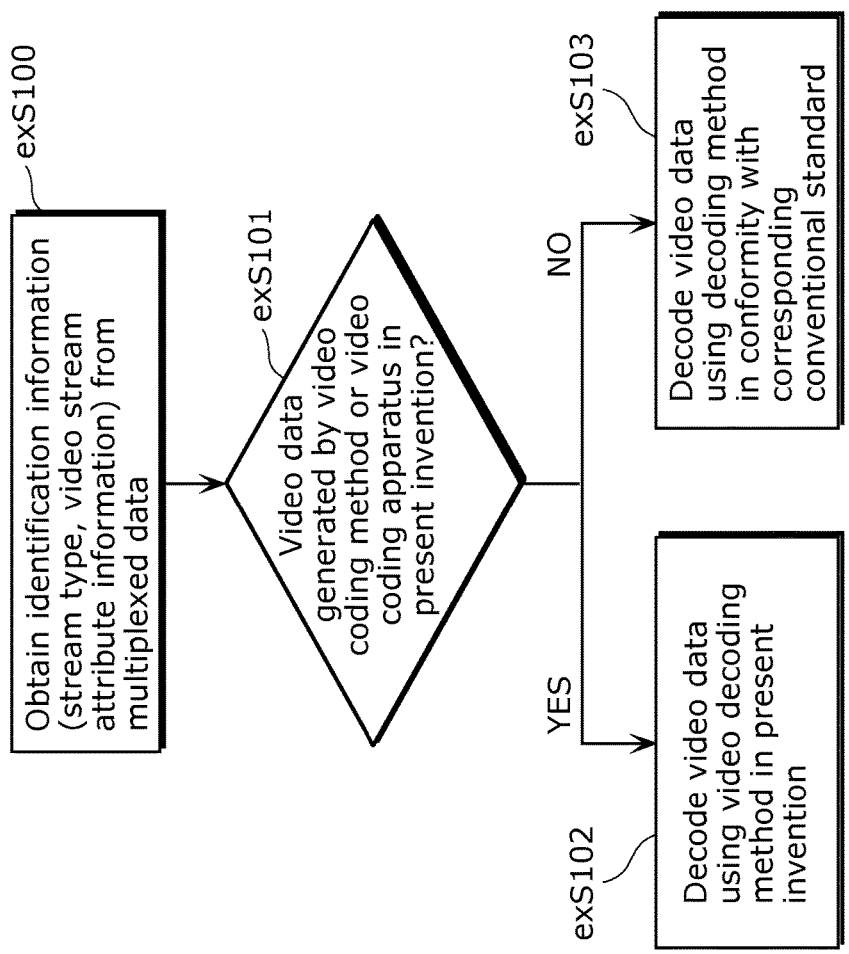

FIG. 31 shows steps for identifying video data.

Figure 32:
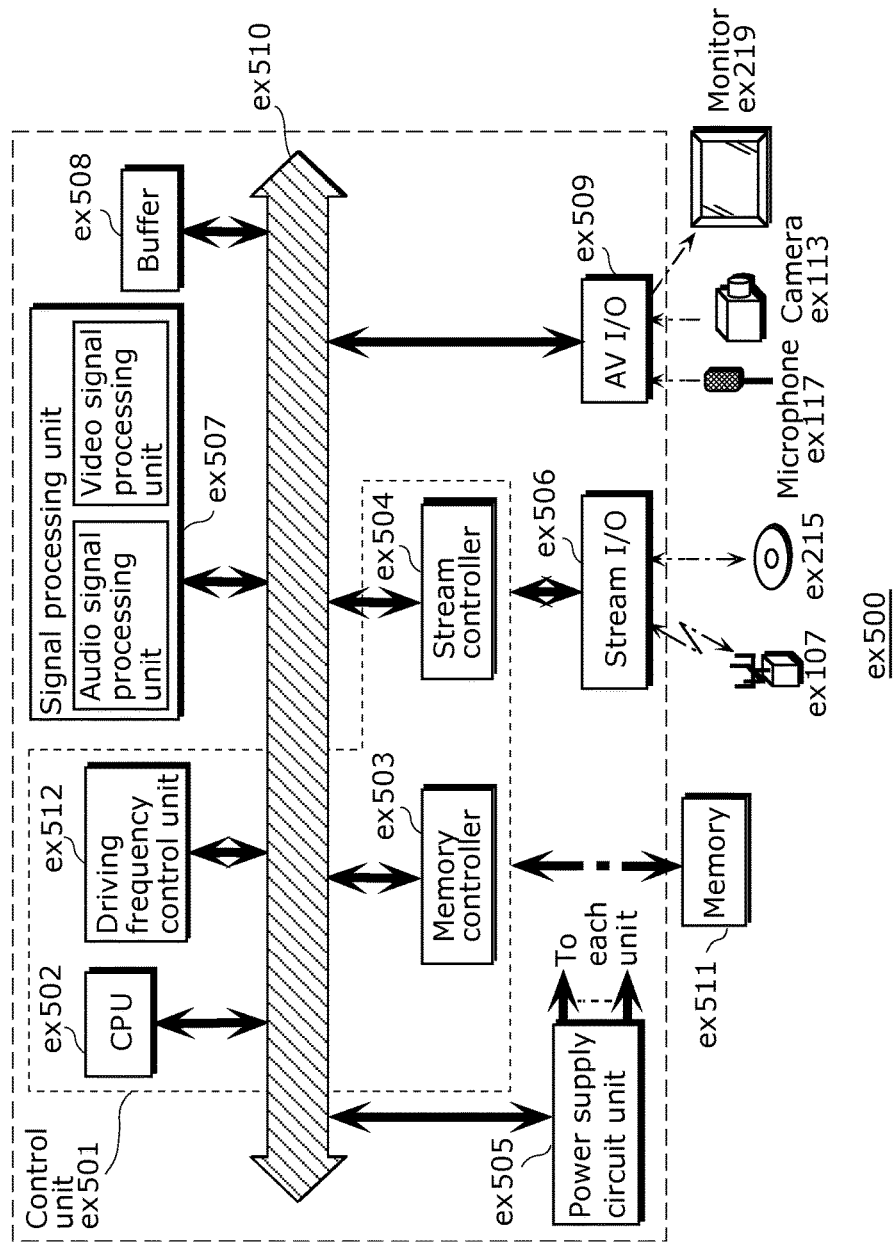

FIG. 32 is a block diagram illustrating an example of a configuration of an integrated circuit for implementing the moving picture coding method and the moving picture decoding method according to each of Embodiments.

Figure 33:
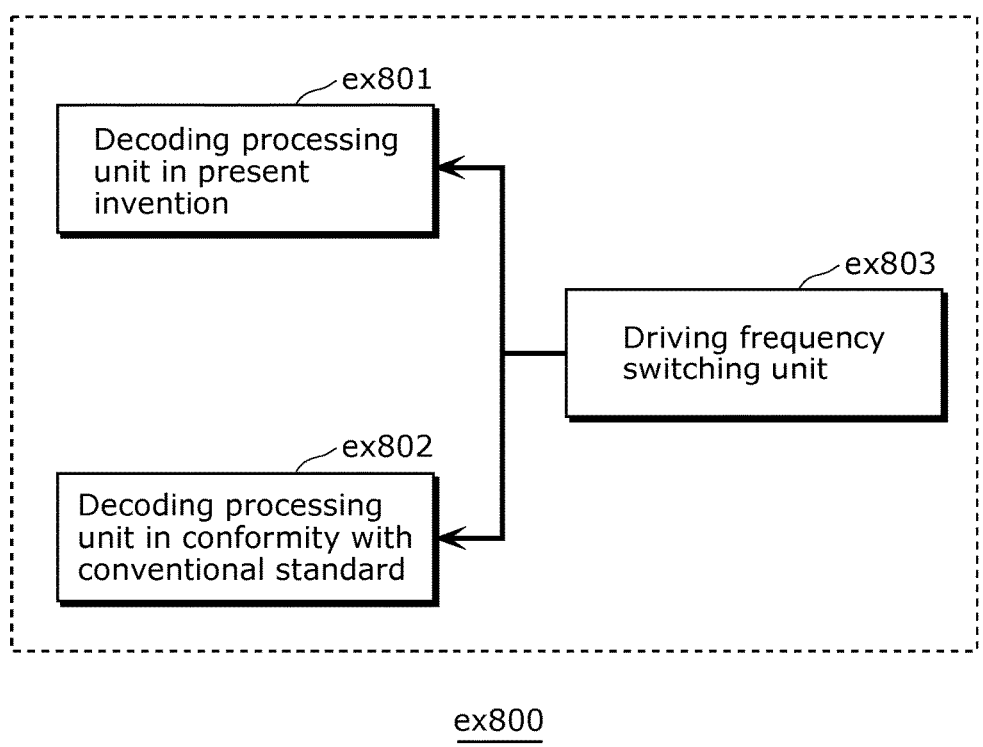

FIG. 33 shows a configuration for switching between driving frequencies.

Figure 34:
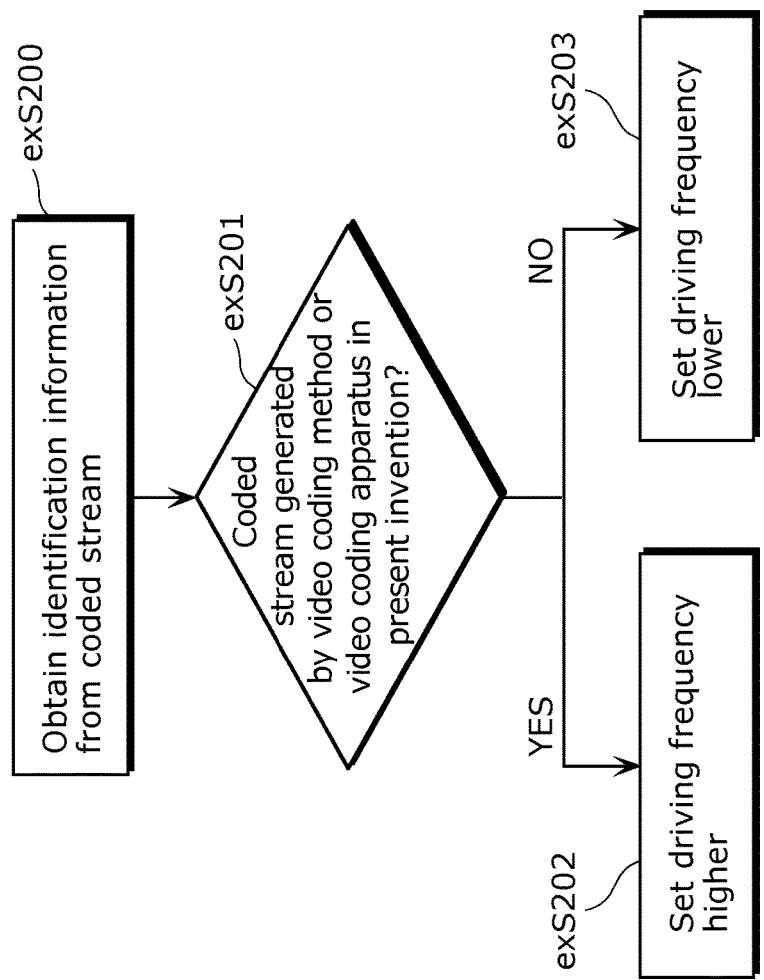

FIG. 34 shows steps for identifying video data and switching between driving frequencies.

FIG. 35 shows an example of a look-up table in which standards of video data are associated with the driving frequencies.

(a) in FIG. 36 shows an example of a configuration for sharing a module of a signal processing unit, and (b) in FIG. 36 shows another example of a configuration for sharing a module of a signal processing unit.

DESCRIPTION OF EMBODIMENTS

First, with reference to an operation of the arithmetic coding process according to the comparison example of the present invention, how the present invention has been attained is described.

Figure 1:
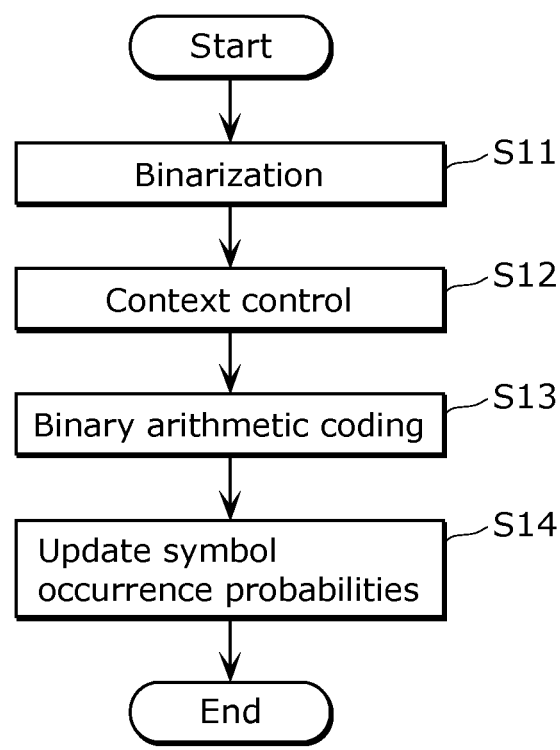
FIG. 1 is a flowchart showing an arithmetic coding method according to a comparison example.

First, with reference to FIG. 1, a flow of arithmetic coding according to the comparison example will be described.

When a current signal to be coded is related to a block size such as quantized coefficients, the block size is determined. When arithmetic coding is started, binarization is first performed in a predetermined method according to a signal type (S11). Next, a context control process is performed according to the signal type including the information of the block size (S12). In the context control process, a symbol occurrence probability corresponding to the signal type is read and outputted from a memory storing a plurality of symbol occurrence probabilities. Next, using the symbol occurrence probability outputted in Step S12, arithmetic coding is performed on the target information and the result is outputted as an output signal (S13).

Then, based on the binarization information calculated in Step S11, the value of the corresponding symbol occurrence probability is updated and is stored as a symbol occurrence probability (S14). When arithmetic coding on the target information is completed, arithmetic coding is performed on the next target information.

Figure 2:
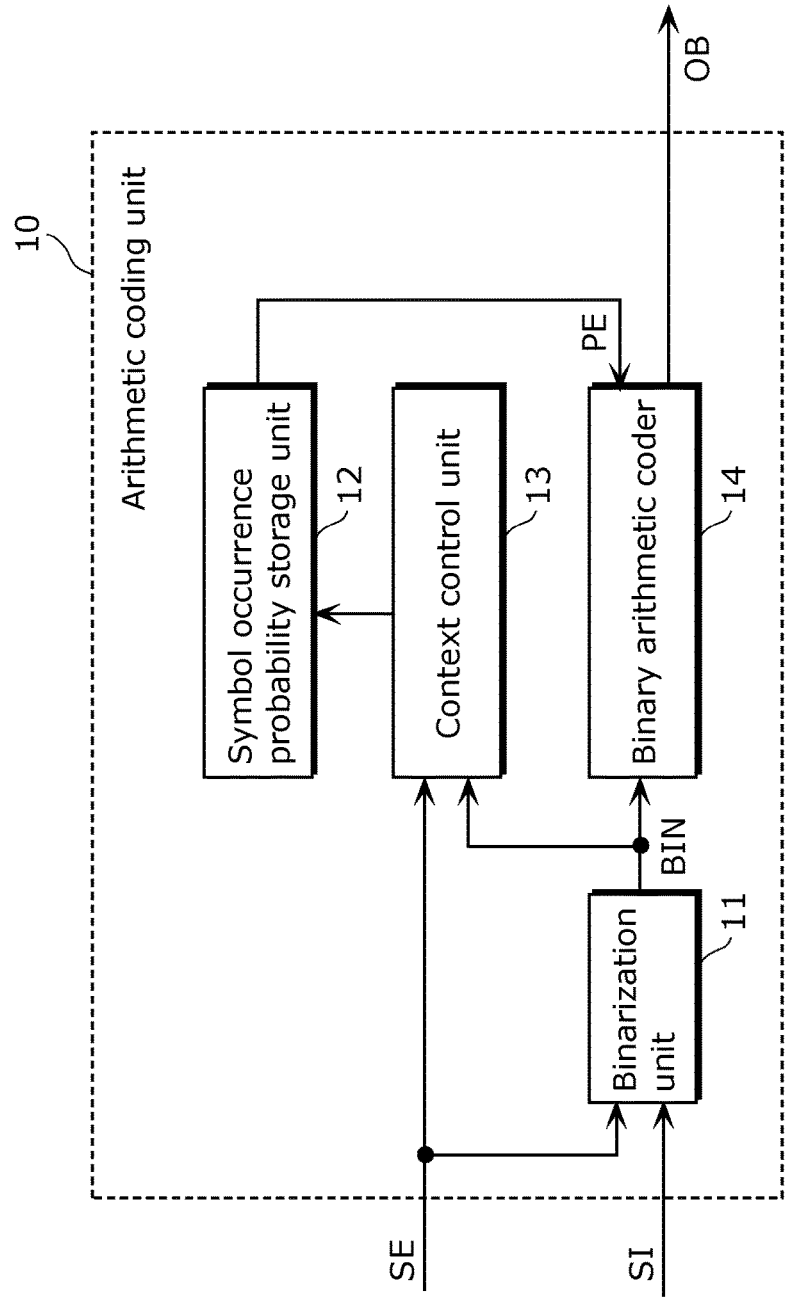
FIG. 2 is a block diagram showing an arithmetic coding apparatus according to a comparison example.

FIG. 2 is a block diagram showing the structure of an arithmetic coding unit showing the process of a conventional arithmetic coding using the conventional H.264/AVC standard. As shown in FIG. 2, an arithmetic coding unit 10 includes a binarization unit 11, a symbol occurrence probability storage unit 12, a context control unit 13, and a binary arithmetic coder 14.

An input signal (SI) that is the current signal to be coded and signal type information indicating a type of the input signal SI are inputted into the arithmetic coding unit 10. The binarization unit 11, based on the signal type information SE, converts the input signal SI into the binary information (symbol) with "0" and "1", and outputs it as a binary signal BIN to the binary arithmetic coder 14 and the context control unit 13.

The context control unit 13 outputs, to the symbol occurrence probability storage unit 12, a symbol occurrence probability PE of a context corresponding to the signal type information SE. Moreover, the context control unit 13, based on the binary signal BIN corresponding to the input signal SI obtained from the binarization unit 11, updates the symbol occurrence probability PE of a context corresponding to the signal type information SE and stores the updated result in the symbol occurrence probability storage unit 12.

The binary arithmetic coder 14, based on the symbol occurrence probability PE, performs arithmetic coding on the binary signal BIN and generates and outputs output bit information OB.

In the arithmetic coding technique, the context control unit 13 derives a symbol occurrence probability for each information type of the current signal. For example, in the H.264 standard, the information type distinguished by the arithmetic coding unit 10 includes the quantized coefficient position (frequency component). In this case, the arithmetic coding unit 10 applies a context such as a symbol occurrence probability different for each of the quantized coefficient positions (each of the frequency components). For example, there are 16 positions (frequency components) when quantized coefficients have a 4 by 4 size, and the arithmetic coding unit 10 performs arithmetic coding using a context different for each of the quantized coefficient positions.

We have found that in the arithmetic coding of a certain type of information, coding efficiency is increased when one context is used for group of some information types, rather than for each information type (the smallest unit). When a context is set for each of the small groups (for example, each of the signal types that are the smallest units), a frequency of updating symbol occurrence probability for the group decreases and a control adapted to characteristics of image data that is a merit of the arithmetic coding is difficult. As a result, coding efficiency decreases.

Furthermore, we hope that a length (or size) of a group to which a common context is applied is variable depending on image data. However, we have found that the information indicating (i) the best length of unit or (ii) the correspondence relationship between the units and the contexts does not exist in the conventional information definition. Furthermore, we have found that the best group length for some of the information types can be determined using a predetermined controlling parameter unit.

The following will describe embodiments of the present invention with reference to the drawings.

Embodiment 1

An outline of a coding method according to Embodiment 1 of the present invention will be described. In the image coding method according to the present embodiment, the signal types to be coded are classified into a predetermined number of groups based on a frequency component, and arithmetic coding is performed on each of the predetermined number of the classified groups, using the symbol occurrence probability prepared for each of the signal types. Mapping information indicating the correspondence relationship between the signal type (or the group type) and a context such as the symbol occurrence probability to be applied is outputted by adding to a coded stream.

With this, when coefficients included in each of the groups are coded, arithmetic coding can be performed using the symbol occurrence probability based on the common statistical information. Therefore, it is possible to increase coding efficiency. Furthermore, by coding one or more coefficients included in a group using the common context, it is possible to decrease the number of contexts as compared to the case where coding is performed using the contexts different for each of the coefficients. Therefore, the memory size when it is implemented can be reduced. Furthermore, even when the groups are changed, a decoding apparatus can perform decoding in which the change is applied.

The above is the description about the outline of the arithmetic coding method according to the present embodiment.

Figure 3:
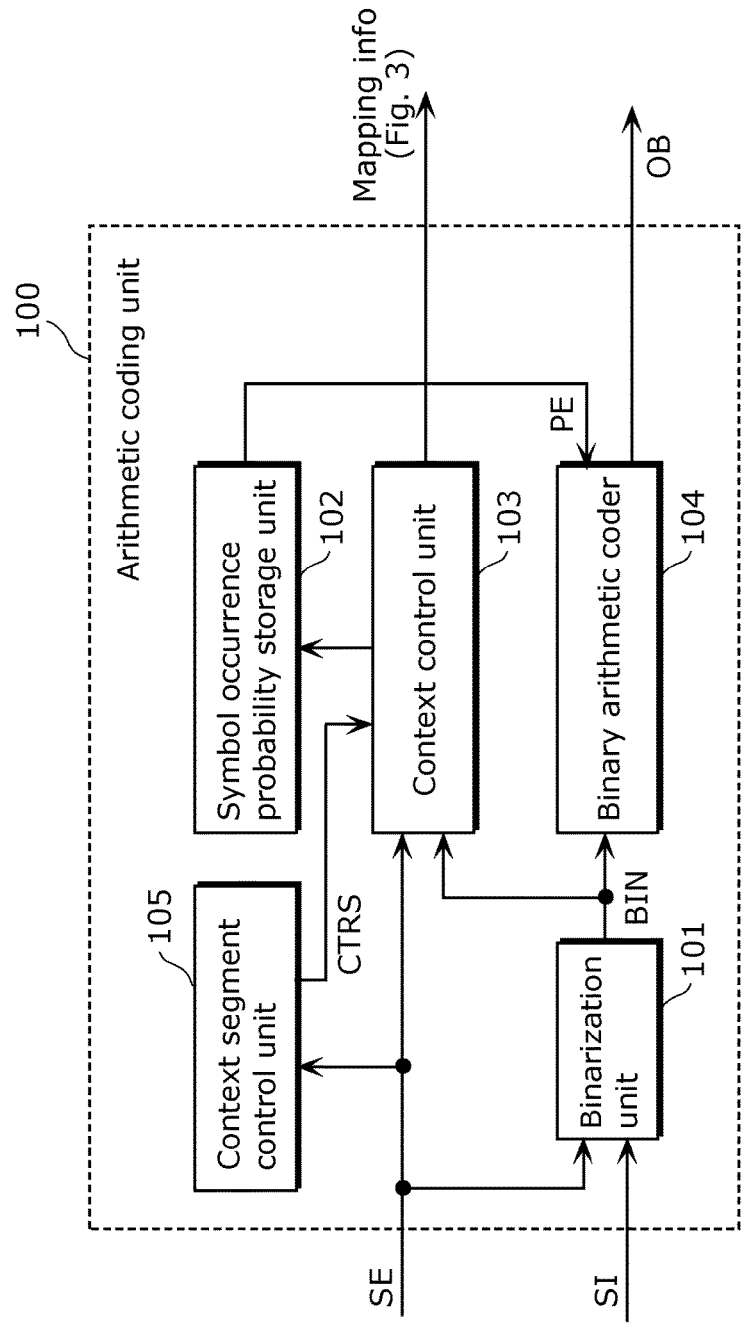
FIG. 3 is a block diagram showing a structure of an arithmetic coding unit according to Embodiment 1 of the present invention.

Next, the structure of the arithmetic coding unit which performs the arithmetic coding method according to the present embodiment will be described. FIG. 3 is a block diagram showing an example of a structure of an arithmetic coding unit 100 according to Embodiment 1 of the present invention. It is to be noted that as will be described later, the arithmetic coding unit 100 according to Embodiment 1 of the present invention corresponds to part of the image coding apparatus which performs compression coding on image data.

As shown in FIG. 3, the arithmetic coding unit 100 includes a binarization unit 101, a symbol occurrence probability storage unit 102, a context control unit 103, a binary arithmetic coder 104, and a context segment control unit 105.

The arithmetic coding unit 100 performs arithmetic coding on an input signal SI that is the current signal to be coded, to generate and output an output signal OB. Moreover, the arithmetic coding unit 100 receives the signal type information SE indicating the type of the input signal SI. When the input signal SI is a signal related to quantized coefficients, the signal type information SE includes the information indicating the coefficient positions.

It is to be noted that the input signal SI is a current signal to be coded of image data. For example, the input signal SI is a signal showing quantized coefficients generated through transforming and quantizing the image data. It is to be noted that the input signal SI may not be quantized coefficients but information used for generating quantized coefficients.

When the input signal SI is one of the plurality of the quantized coefficients included in the macroblock, the signal type information SE may be information indicating the position (coefficient position) within a macroblock of the quantized coefficient.

Moreover, the input signal SI may be information including whether or not the quantized coefficients surrounding the quantized coefficient are zero or non-zero. More specifically, the input signal SI may include information including whether or not the quantized coefficients of the DC component of the macroblock are zero or non-zero.

Furthermore, the input signal SI may include a signal indicating whether or not a non-zero coefficient is last in a particular scan order when one of a plurality of quantized coefficients scanned in the order is the non-zero coefficient.

The binarization unit 101 binarizes the current signal to be coded, to generate a binary signal. Specifically, the binarization unit 101 performs binarization on the input signal SI based on the input signal SI and the signal type information SE, to generate a binary signal BIN. More specifically, the binarization unit 101 generates the binary signal by binarizing a coefficient in a frequency domain which is included in a unit of processing, indicated by the input signal SI.

It is to be noted that the unit of processing is a block obtained by partitioning an image in a spatial domain or a frequency domain. A coding process is performed for each of the units of processing. For example, the unit of processing is a transform unit (TU). It is to be noted that although the unit of processing is referred to as a macroblock, the unit of processing is not limited only to the macroblock.

The symbol occurrence probability storage unit 102 is a memory or the like which holds a plurality of symbol occurrence probabilities. The symbol occurrence probability storage unit 102, for example, holds a symbol occurrence probability table. The symbol occurrence probability table is a table in which contexts and probability information items are associated. Details of the symbol occurrence probability table will be described later.

The symbol occurrence probability storage unit 102, for example, holds a context table. The context table is a table in which types of the current signals to be coded and contexts are associated. Details of the context table will be described later.

The context control unit 103 determines the context of the current signal to be coded, based on the type of the current signal to be coded. Specifically, first, the context control unit 103 obtains the signal type information SE and also obtains a control signal CTRS from the context segment control unit 105. The context control unit 103 then determines the context of the current signal to be coded by referring to the context table based on the obtained signal type information SE and the obtained control signal CTRS.

At this time, the context control unit 103 determines the context based on the group designated by the control signal CTRS. Here, in the case where one group includes a plurality of coefficients, the context control unit 103 determines the context common to these coefficients. Specifically, the context control unit 103 determines, as a context for a binary signal, the context common to a plurality of coefficients included in the group indicated by the control signal CTRS.

The context control unit 103 may hold the context table. Mapping information (mapping Info) for reconstructing a context table is coded by an entropy coding unit 220 to be described later, and is outputted by adding the coded mapping information to the coded stream. It is to be noted that the mapping information is information indicating a correspondence relationship between (i) a group of information types to which the first context is commonly applied, a group of information types to which the second context is commonly applied, and a group of information types to which the n-th context is commonly applied and (ii) the respective contexts.

An operation of the context segment control unit 105 will be described later.

Furthermore, the context control unit 103 determines the coding probability information item corresponding to the determined context. In other words, by referring to the symbol occurrence probability table, the context control unit 103 determines which one of the plurality of symbol occurrence probabilities stored in the symbol occurrence probability storage unit 102 is to be used. The coding probability information item is a probability information item used in arithmetic coding of a binary signal. It is to be noted that the coding probability information item indicates an index indicating a value of the symbol occurrence probability or indicates a value of the symbol occurrence probability, for example. In the following, the coding probability information item is also referred to simply as probability information item.

The context control unit 103 reads the symbol occurrence probability corresponding to the determined context from the symbol occurrence probability storage unit 102 and then outputs the symbol occurrence probability to the binary arithmetic coder 104.

The binary arithmetic coder 104 performs arithmetic coding on the binary signal using the coding probability information item. Specifically, using the symbol occurrence probability PE outputted by the symbol occurrence probability storage unit 102, the binary arithmetic coder 104 performs the arithmetic coding on the binary signal BIN generated by the binarization unit 101.

The above is a description about the structure of the arithmetic coding unit 100 according to the present embodiment.

The symbol occurrence probability table held by the symbol occurrence probability storage unit 102 will be described. FIG. 4 is a diagram showing an example of a structure of a symbol occurrence probability table according to Embodiment 1 of the present invention.

The symbol occurrence probability table is a table in which contexts and symbol occurrence probabilities are associated. An index (ctxIdx) in FIG. 4 is an index indicating a context. Specifically, the index is an index which is determined according to peripheral information on a macroblock being coded, already-coded information on the block, or a position of a bit to be coded.

An entry indicated by each index includes probability information item (pStateIdx) indicating the symbol occurrence probability and a symbol (valMPS) indicating a symbol having a high occurrence probability (Most Probable Symbol). These are equivalent to those specified in the H.264 standard. In other words, pStateIdx is an index indicating a value of the symbol occurrence probability. The symbol occurrence probability storage unit 102 further holds a table indicating a value of the symbol occurrence probability which corresponds to pStateIdx.

Although the symbol occurrence probability is managed here using a table in which the index (pStateIdx) indicating the symbol occurrence probability is associated with the context (ctxIdx), the symbol occurrence probability may be managed through direct association between the context and the value of the symbol occurrence probability. In this case, the value of the symbol occurrence probability is expressed with, for example, 16-bit accuracy (0-65535), which makes it possible to deal with more detailed values than those in the management using the above table. The coding efficiency can therefore be increased. The following describes a method of managing the symbol occurrence probability as a value.

Next, the context table held by the symbol occurrence probability storage unit 102 is described. FIG. 5 is a diagram showing an example of the context table according to Embodiment 1 of the present invention.

The context table is a table in which a plurality of types and contexts are associated. In the case where the input signal SI is a signal involving a quantized coefficient and the signal type information SE includes quantized coefficient position information within the block, the context segment control unit 105 selects a context table which is associated with the type of the current signal to be coded. In the context table shown in FIG. 5, a numeral of the signal type information SE corresponds to scan order. In other words, the signal type information SE in FIG. 5 indicates, with the numeral 0, a coefficient of a direct-current (DC) component that is a low-frequency component, and with a larger numeral, a coefficient of a higher frequency component.

Furthermore, a set of coefficients (numerals of the signal type information SE) associated with the same context corresponds to one group. In other words, the same context is set for all the coefficients included in the same group in FIG. 5.

For example, (a) in FIG. 5 shows that the numerals 0 to 2 of the signal type information SE indicate coefficients included in the first group. Furthermore, a common context (a context having a context index "0") is set for the plurality of coefficients included in the first group. Moreover, the numerals 3 to n of the signal type information SE are coefficients included in the second group, and a context having a context index "1" is set. Furthermore, in the case where the coefficient position indicated by the signal type information SE is beyond a certain position (that is, SE≥20), all the coefficient positions beyond the certain position are coefficients included in the fourth group and a context index "3" is set, as shown in (b) of FIG. 5. It is to be noted that FIG. 5 omits illustration of the third group.

The context table shows a correspondence relationship between the information types and the contexts, and it is added to a bitstream as mapping information.

(c) in FIG. 5 is a diagram showing an example of another coding of mapping information. (c) in FIG. 5 shows an index of mapping information (4×4mapIdx) and mapping information corresponding to each of the indexes. The mapping information shows a correspondence relationship between one of the positions of a 4×4 quantized coefficient (frequency components 0 to 15) as the information type SE and a corresponding context. In this case, a coding apparatus and a decoding apparatus locally hold each 4×4 mapping info. The entropy coding unit codes any of the values 0 to n of 4×4mapIdx, to add it to a bitstream.

For example, in the example of 4×4mapIdx=0, the context 0 is associated with the frequency component 0 (first group), the context 1 is associated with the frequency components 1 to 2 (second group), the context 2 is associated with the frequency components 3 to 9 (third group), and the context 3 is associated with the frequency components 10 to 15 (fourth group). In other words, the first group including the DC component is the smallest example and the third group is the largest example.

Moreover, in the example of 4×4mapIdx=1, the context 0 is associated with the frequency components 0 to 2 (first group), the context 1 is associated with the frequency components 3 to 5 (second group), and the context 2 is associated with the frequency components 6 to 15 (third group). In other words, the first group including the DC component is the smallest example and the third group including the highest frequency component 15 is the largest example.

Moreover, in the example of 4×4mapIdx=2, the context 0 is associated with the frequency component 0 to 3 (first group), and the context 1 is associated with the frequency components 4 to 15 (second group). Moreover, in the example of 4×4mapIdx=k, the context 0 is associated with the frequency component 0 (first group), and the context 1 is associated with the frequency components 1 to 15 (second group). The first group including the DC component is the smallest example and the third group including the highest frequency component 15 is the largest example.

As described in each of the examples, it is desirable for the groups have various sizes (various number of coefficients). According to the characteristics of coefficients of each frequency component, it is possible to be segmented into a group of an appropriate size. For example, since a coefficient of the DC component has a high probability of becoming non-zero, it is desirable that the group including the DC component is relatively small. Meanwhile, since a coefficient of a high frequency component has a high probability of becoming zero, it is desirable that the group including the component is relatively large.

Meanwhile, in the example of 4×4mapIdx=n, the frequency components 0 to 15 and the contexts 0 to 15 correspond to each other on a one-to-one basis. In other words, it is an example of the case where the sizes of all the groups are the same.

By referring to the context table shown in FIG. 5, the context control unit 103 determines a context for a plurality of binarized coefficients included in a group on which binary arithmetic coding is to be performed.

It is to be noted that "segmenting a block into a plurality of blocks and determining a context corresponding to each of the groups" includes, for example, as shown in (c) in FIG. 5, selection of one of the prepared patterns (patterns of (i) block segmentation and (ii) a correspondence relationship between a context and each of the groups).

Figure 6:
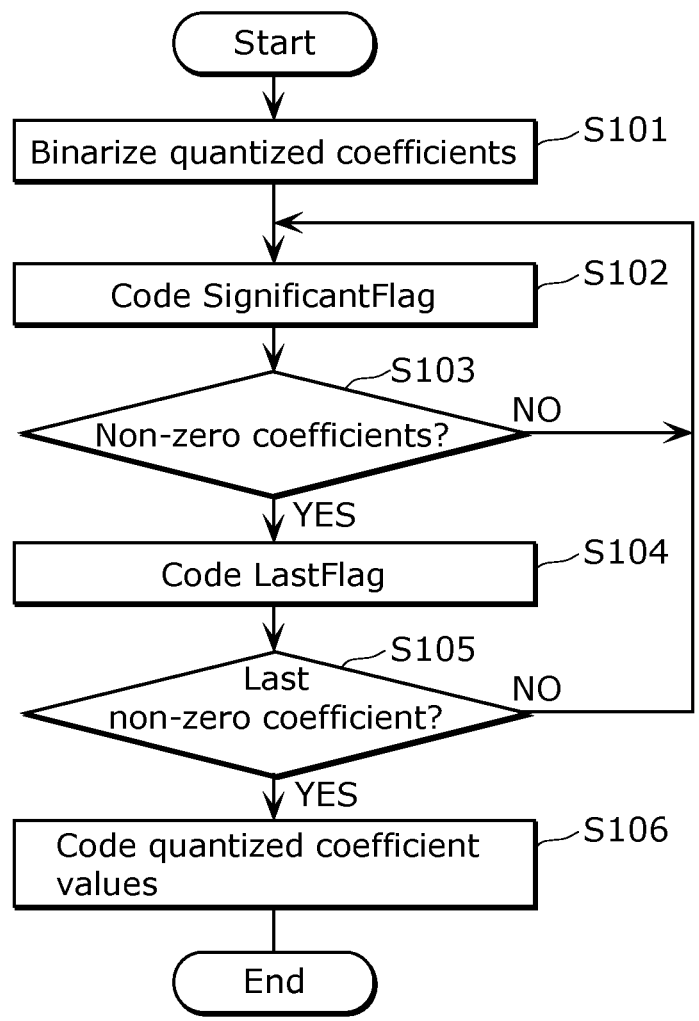
FIG. 6 is a flowchart showing an example of an arithmetic coding method according to Embodiment 1 of the present invention.

Next, an arithmetic coding method performed by the arithmetic coding unit 100 shown in FIG. 3 will be described with reference to a flowchart shown in FIG. 6. FIG. 6 is a flowchart showing an example of an arithmetic coding method according to Embodiment 1 of the present invention. Furthermore, FIG. 6 shows arithmetic coding applied in the case where the current signal to be coded forms a quantized coefficient group which corresponds to one block, and information on whether each of the coefficients in the quantized coefficient group corresponding to the one block is zero or non-zero is coded.

As shown in FIG. 6, the binarization unit 101 first performs binarization on each of the quantized coefficients included in the input signal SI that is to be coded (S101). Specifically, the binarization unit 101 reads the quantized coefficients included in the input signal SI in a predetermined scan order (for example, a zigzag scan order). At this time, the binarization unit 101 expresses, as "0" or "1", whether the quantized coefficient is a non-zero coefficient (a coefficient that is not 0) or the quantized coefficient is a zero coefficient (a coefficient that is 0), to thereby perform the binarization. Specifically, the binarization unit 101 generates, as a binary signal, a signal indicating whether or not the quantized coefficient is a non-zero coefficient. The binary signal generated here is referred to as SignificantFlag.

Here, in the case where the quantized coefficient is a non-zero coefficient, the binarization unit 101 expresses, as "0" or "1", whether or not there is still any non-zero coefficient, following that non-zero coefficient in the above-mentioned scan order, to thereby generate a binary signal. The binary signal generated here is referred to as LastFlag.

As a result of generation of the binary signal as above, there is no need to code SignificantFlag of a zero-coefficient which is scanned after the last non-zero coefficient in the scan order, which allows a reduction in the amount of data.

Next, the arithmetic coding unit 100 performs arithmetic coding on SignificantFlag that is one of the binary signals (S102). The arithmetic coding may be the same method as that in H.264, for example. Next, the arithmetic coding unit 100 determines whether or not a coefficient that is to be coded is a zero coefficient (S103).

Next, when a coding target coefficient is a zero coefficient (NO in S103), the arithmetic coding unit 100 performs processing on next SignificantFlag. On the other hand, when the coding target coefficient is a non-zero coefficient (YES in S103), the arithmetic coding unit 100 performs arithmetic coding on LastFlag that indicates whether this non-zero coefficient is the last non-zero coefficient in scan order (S104). Details of the arithmetic coding will be described later.

Next, the arithmetic coding unit 100 determines whether or not a coefficient that is to be coded is the last non-zero coefficient in scan order (S105). Here, when the coding target coefficient is not the last non-zero coefficient in scan order (NO in S105), the arithmetic coding unit 100 performs processing on next SignificantFlag. On the other hand, when the coding target coefficient is the last non-zero coefficient in scan order (YES in S105), the arithmetic coding unit 100 performs coding on information on a coefficient value (a coefficient level) of the non-zero coefficient (S106). Here, a method for the coding (specifically, binarization and arithmetic coding) on the coefficient level of the non-zero coefficient is, for example, the same method as that in H.264.

Figure 7:
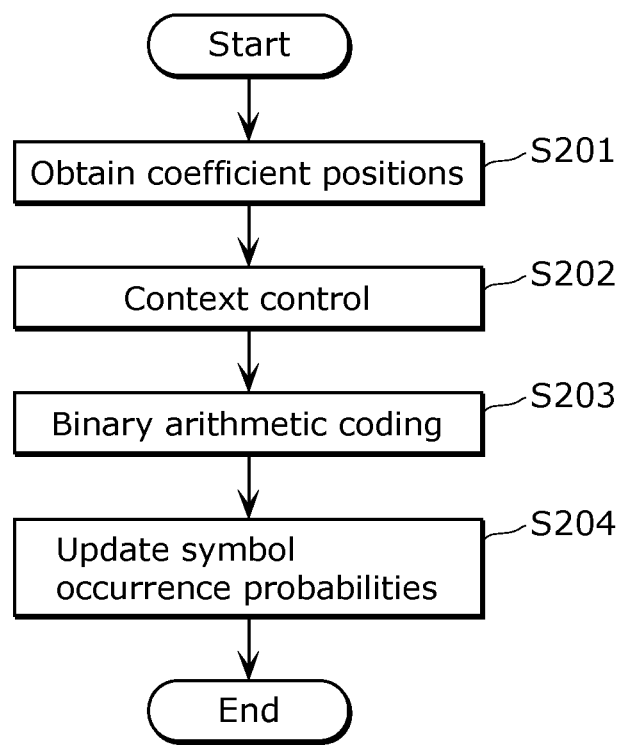
FIG. 7 is a flowchart showing an example of an arithmetic coding method according to Embodiment 1 of the present invention.

FIG. 7 is a flowchart showing an example of an arithmetic coding method according to Embodiment 1 of the present invention. For example, the arithmetic coding method in FIG. 7 corresponds to the arithmetic coding step shown in FIG. 6 (S102 and S104 in FIG. 6).

In the arithmetic coding method in FIG. 7, first, a block including coefficients of frequency components is segmented into groups corresponding to frequency ranges based on types of the coefficients, and a context corresponding to each of the groups is determined (S201, S202). Next, binary arithmetic coding is performed, for each of the coefficients, on the coefficient according to a probability information item corresponding to the context, the context being corresponding to the group having the coefficient (S203). Updating is performed, for each of probability information items, on the probability information item corresponding to the context, based on the coefficient included in the group corresponding to the context (S204).

Specifically, the context segment control unit 105 first obtains the signal type information SE including position information (S201). Next, the context segment control unit 105 determines a group of the current signal to be coded, based on the obtained position information and outputs, to the context control unit 103, the control signal CTRS identifying the determined group. By referring to the context table associated with the type of the current signal to be coded, the context control unit 103 determines, as a context which corresponds to the input signal SI, a context which corresponds to the group that is indicated by the control signal CTRS obtained from the context segment control unit 105 (S202). Details of an operation of the context segment control unit 105 will be described later.

Next, the symbol occurrence probability storage unit 102 reads the symbol occurrence probability corresponding to the context determined by the context control unit 103, and outputs it as a coding probability information item to the binary arithmetic coder 104.

The binary arithmetic coder 104 performs arithmetic coding on the binary signal using the coding probability information item (S203). Specifically, the binary arithmetic coder 104 performs arithmetic coding on the binary signal obtained from the binarization unit 101, in the method specified in the H.264 standard, using the symbol occurrence probability obtained from the symbol occurrence probability storage unit 102.

The context control unit 103 updates the probability information item based on the binary signal generated by the binarization unit 101 (S204). Specifically, the context control unit 103 updates, from among the symbol occurrence probabilities stored in the symbol occurrence probability storage unit 102, the symbol occurrence probability which corresponds to the context of the current signal to be coded according to the binary signal obtained from the binarization unit 101. The updating of the symbol occurrence probability is performed in the method specified in the H.264 standard, for example.

Figure 9A:
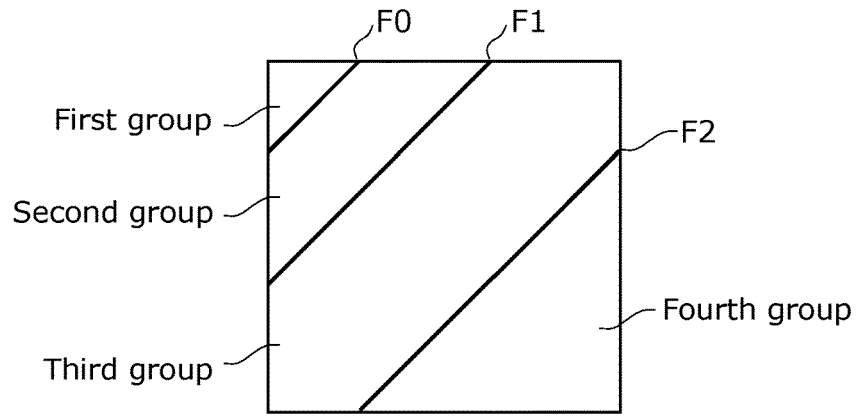
FIG. 9A is a schematic view of groups set with respect to a block.
Figure 9B:
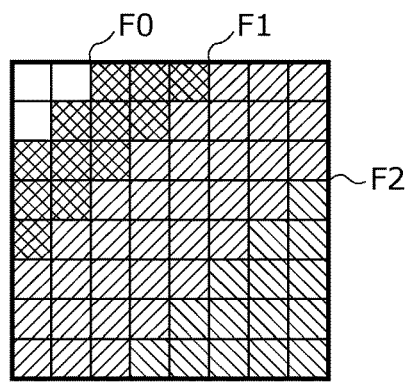
FIG. 9B is a diagram showing an example of coefficients included in each of the groups in 8 by 8 blocks.
Figure 9C:
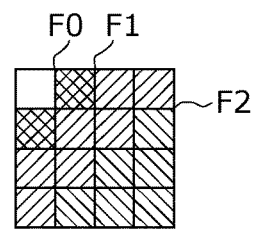
FIG. 9C is a diagram showing an example of coefficients included in each of the groups in 4 by 4 blocks.

Next, with reference to FIG. 8 and FIGS. 9A to 9C, an operation of the context segment control unit 105 (which corresponds to steps S201 to S202 in FIG. 7) is described. FIG. 8 is a flowchart showing an example of an operation of the context segment control unit 105 according to Embodiment 1 of the present invention. FIGS. 9A to 9C each schematically illustrate the operation of the context segment control unit 105 according to Embodiment 1 of the present invention.

The context segment control unit 105 operates as follows in the case where the above-mentioned LastFlag is coded, for example.

The context segment control unit 105 obtains coefficient position information on LastFlag that is to be coded (S301). Next, as indicated in the following Steps S302 to S308, the context segment control unit 105 determines a context of LastFlag based on a frequency component which can be obtained from the coefficient position information on LastFlag.

The quantized coefficient is a signal obtained by frequency-transforming and quantizing an image signal. Thus, the coefficient position corresponds to a frequency component used in the quantized coefficient on which frequency transformation has been performed. For example, a quantized coefficient corresponding to a low frequency component is located in the upper-left part while a quantized coefficient corresponding to a high frequency component is located in the lower-right part.

The quantized coefficients are read in a particular scan order as described above. Here, the scan order may be a method called zigzag scanning through which the block is read in sequence from the upper-right part toward the lower-left part and at an end of the block, the reading direction changes, as specified in H.264, for example. With this scan, a quantized coefficient for each of the positions is sequentially stored in a one-dimensional array having a continuity of corresponding frequency component.

As described above, the information types SE, according to any characteristics, are segmented into the groups of the predetermined number of information types (first group, second group, third group, and fourth group). For example, in the case of the present embodiment, the group of information items of quantized coefficients in a domain of frequency components lower than a predetermined frequency component F0 is classified as the first group. Moreover, the group of information items in a domain of frequency components higher than or equal to the frequency component F0 and frequency components lower than the frequency component F1 is classified as the second group. Moreover, the group of information items of quantized coefficients in a domain of frequency components higher than or equal to the frequency component F1 and frequency components lower than the frequency component F2 is classified as the third group. Moreover, the group of information items of quantized coefficients in a domain of frequency components higher than or equal to the frequency component F2 is classified as the fourth group.

Next, a context each corresponding to the first to the n-th group (the first context, the second context, . . . the n-th context) is set for the one-dimensional array generated by a scan.

Specifically, when LastFlag to be coded is included in a domain of frequency components lower than a predetermined frequency component F0, in other words, when it is included in the first group (YES in S302), the context segment control unit 105 sets a first context corresponding to the frequency component F0 for the LastFlag (S303).

On the other hand, when LastFlag to be coded is included in a domain of frequency components higher than the frequency component F0 (NO in S302), the context segment control unit 105 compares a frequency component corresponding to LastFlag to be coded, with a frequency component F1 that is higher in frequency than the frequency component F0 (S304). Here, when the LastFlag is included in a domain of frequency components lower than the frequency component F1, in other words, when it is included in the second group (YES in S304), the context segment control unit 105 sets a second context corresponding to the frequency component F1 for the LastFlag (S305).

On the other hand, when LastFlag to be coded is included in a domain of frequency components higher than the frequency component F1 (NO in S304), the context segment control unit 105 compares the frequency component corresponding to LastFlag to be coded, with the frequency component F2 that is higher in frequency than the frequency component F1 (S306). Here, when LastFlag to be coded is included in a domain of frequency components lower than the frequency component F2, in other words, when it is included in the third group (YES in S306), the context segment control unit 105 sets a third context corresponding to the frequency component F2 for the LastFlag (S307).

On the other hand, when LastFlag to be coded is included in a domain of frequency components higher than the frequency component F2, in other words, when it is included in the fourth group (NO in S306), the context segment control unit 105 sets a fourth context corresponding to a high frequency component for the LastFlag (S308). Information identifying the contexts set as above is outputted, as the control signal CTRS, to the context control unit 103.

A low frequency component including a DC component is a signal in which characteristics of an image are most likely to appear. Furthermore, in the low-frequency component including a DC component, SignificantFlag and LastFlag are often present as binary signals. Accordingly, the low-frequency component including a DC component is a frequency component from which statistical information is easily obtained. Thus, setting a smaller group in the domain of low-frequency components than a group in the domain of high-frequency components allows arithmetic coding which uses statistical information more adapted to the characteristics of the image, and thereby allows an increase in the coding efficiency.

With reference to FIGS. 9A to 9C, more details are described. FIG. 9A schematically shows groups set for a block. FIG. 9B shows an example of coefficients included in each of the groups in an 8 by 8 block. FIG. 9C shows an example of coefficients included in each of the groups in a 4 by 4 block. In FIGS. 9A to 9C, F0, F1, and F2 represent the comparison values in Steps S302, S304, and S306 of FIG. 8, respectively.

A square shown in FIG. 9A indicates a block that is a unit of processing. In the block, coefficients are arranged so that their frequency components have frequencies ascending from the upper-left part to the lower-right part. Here, the frequency components F0, F1, and F2 are determined.

The first context is set for the domain (first group) of frequency components lower than the frequency component F0. The second context is set for the domain (second group) surrounded by the frequency component F0 and the frequency component F1. The third context is set for the domain (third group) surrounded by the frequency component F1 and the frequency component F2. The fourth context for high frequency components is set for the domain of frequency components higher than the frequency component F2.

At the time of coding LastFlag, the context segment control unit 105 is capable of determining a context of LastFlag by determining which one of the groups a coefficient corresponding to LastFlag is included in.

As shown in FIG. 9A, the block is segmented such that the first group for the low-frequency component is smaller than the first to fourth groups for the high-frequency component. This is because the quantized coefficient in the low-frequency component is often non-zero as compared to the case of the quantized coefficient in the high-frequency component, and setting the groups as above allows statistical information to be used with an appropriate balance. The coding efficiency can therefore be increased.

FIG. 9B shows an example of the case in which the groups as shown in FIG. 9A are applied to an 8 by 8 block. In this case, the first context is set for three coefficients (first group) in the upper-left part, the second context is set for coefficients in a domain (second group) surrounded by the frequency components F0 and F1, the third context is set for coefficients in a domain (third group) surround by the frequency components F1 and F2, and lastly the fourth context for high frequency is set for coefficients (fourth group) in a domain higher than the frequency component F2. This also applies to a coefficient block of more than or equal to 8 by 8.

In the example of FIG. 9B, the first group including a DC component includes three coefficients, the second group includes 12 coefficients, the third group includes 34 coefficients, and the fourth group including the highest frequency component includes 15 coefficients. In other words, the number of coefficients in the first group is less than or equal to the number of coefficients in the other groups. Moreover, the number of coefficients in the third group between the first group and the fourth group is larger than the number of coefficients in the other groups.

Meanwhile, FIG. 9C shows an example in which the groups as shown in FIG. 9A are applied to a 4 by 4 coefficient block. This case is similar to the case of FIG. 9B except that a coefficient included in the first group is only a coefficient corresponding to a direct-current (DC) component.

It is to be noted that the segment method shown here is a mere example, and it is not limited to the above example. For example, the size may be set for each of the groups such that a group including coefficients in the low frequency domain is small (the number of coefficients belonging to the group is small) while a group including coefficients in the high frequency domain is large (the number of coefficients belonging to the group is large). Moreover, the number of groups and the boundary position of the groups are not limited to such. For example, the group located in a domain of the lowest frequency may be a group which includes only one coefficient. Moreover, for example, the number of groups may be two.

It is to be noted that although in the present invention, the context table shown in FIG. 5 is coded as mapping information, the frequency components F0, F1, F2, and the like may be recorded as delimiter information for each of the predetermined units (units corresponding to slices and pictures, or the like).

Figure 10:
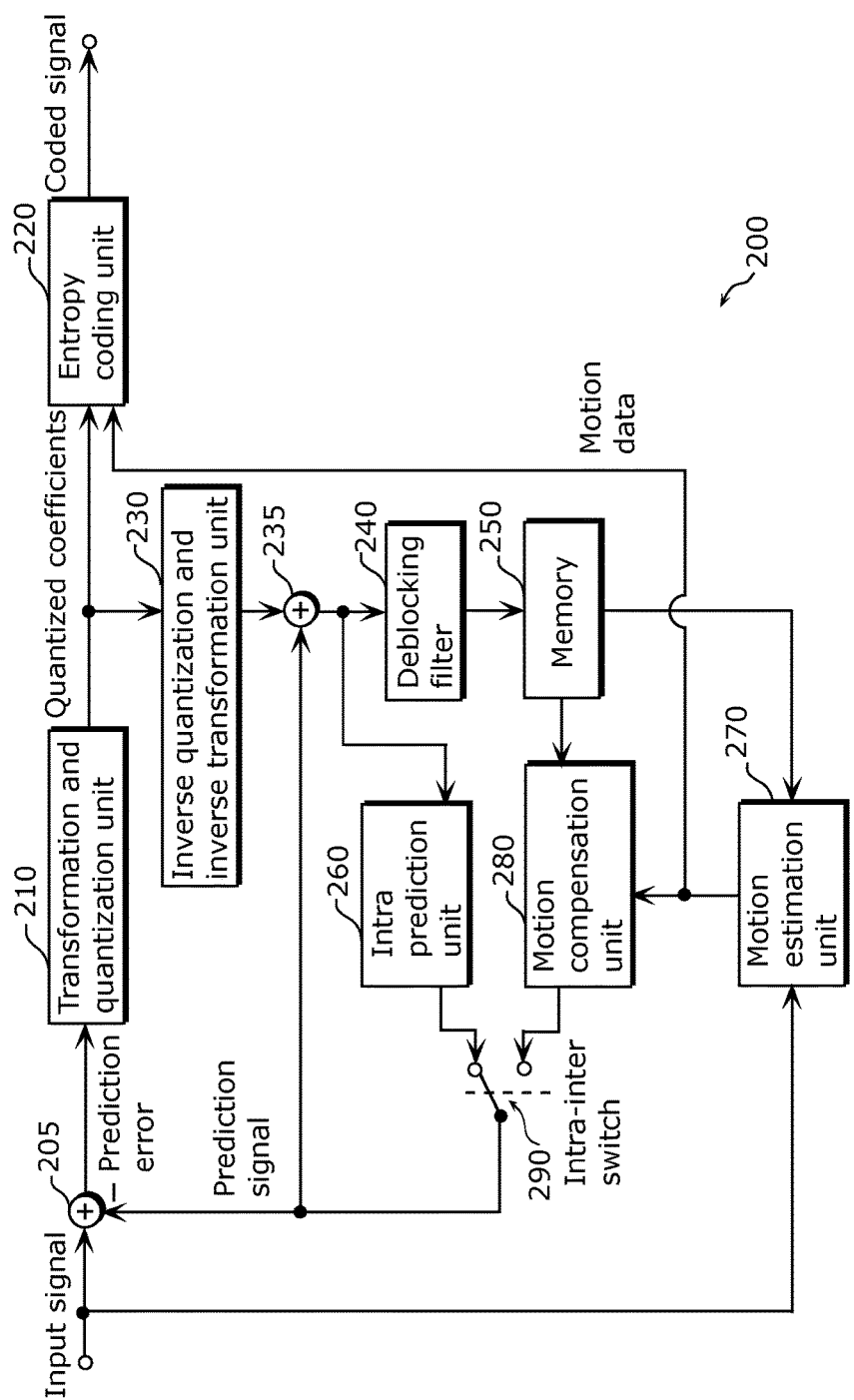
FIG. 10 is a block diagram showing a structure of an image coding apparatus according to Embodiment 1 of the present invention.

The arithmetic coding unit 100 according to Embodiment 1 of the present invention is included in an image coding apparatus which compresses and codes image data. FIG. 10 is a block diagram showing an example of a structure of an image coding apparatus 200 according to Embodiment 1 of the present invention.

The image coding apparatus 200 compresses and codes image data. For example, the image coding apparatus 200 receives, for each block, the image data as an input signal. The image coding apparatus 200 performs transform, quantization, and entropy coding on the received input signal, to generate a coded signal.

Figure 14:
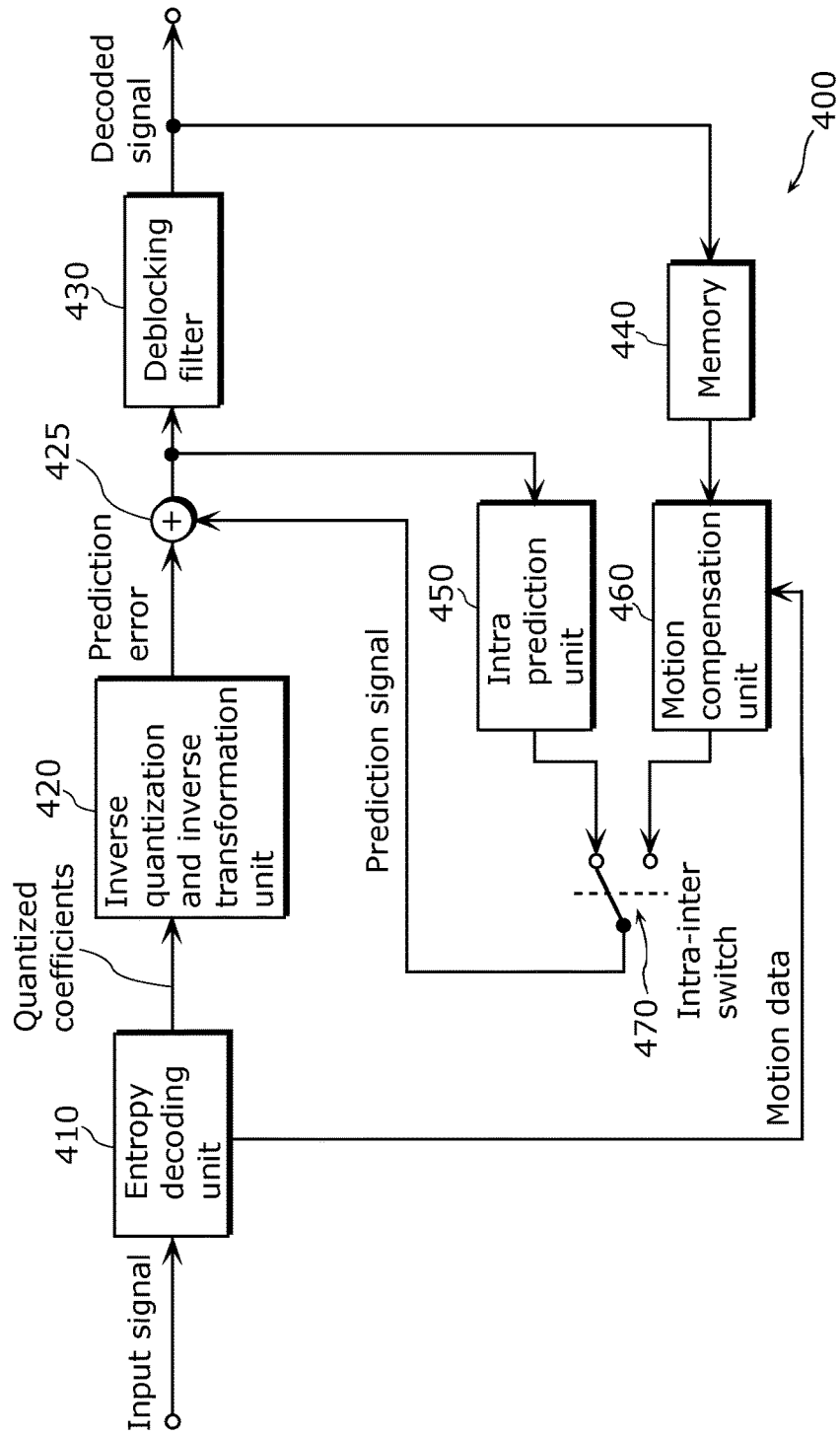
FIG. 14 is a block diagram showing a structure of an image decoding apparatus according to Embodiment 2 of the present invention.

As shown in FIG. 14, the image coding apparatus 200 includes a subtractor 205, a transformation and quantization unit 210, an entropy coding unit 220, an inverse quantization and inverse transformation unit 230, an adder 235, a deblocking filter 240, a memory 250, an intra prediction unit 260, a motion estimation unit 270, a motion compensation unit 280, and an intra-inter switch 290.

The subtractor 205 calculates a difference between an input signal and a prediction signal, that is, a prediction error.

The transformation and quantization unit 210 performs frequency transformation on a prediction error in the spatial domain, to generate a transform coefficient in the frequency domain. For example, the transformation and quantization unit 210 performs a discrete cosine transform (DCT) on the prediction error, to generate a transform coefficient. Furthermore, the transformation and quantization unit 210 quantizes the transform coefficient, to generate a quantized coefficient.

The entropy coding unit 220 performs variable length coding on the quantized coefficient, to generate a coded signal. Moreover, the entropy coding unit 220 codes motion data (for example, a motion vector) estimated by the motion estimation unit 270 and includes the coded motion data in the coded signal, thereafter outputting the resultant coded signal.

The inverse quantization and inverse transformation unit 230 reconstructs the transform coefficient by inversely quantizing the quantized coefficient. Furthermore, the inverse quantization and inverse transformation unit 230 reconstructs the prediction error by inversely transforming the reconstructed transform coefficient. Because of information loss due to the quantization, the reconstructed prediction error is not categorically identical to the prediction error generated by the subtractor 205. In other words, the reconstructed prediction error includes a quantization error.

The adder 235 generates a local decoded image by adding the reconstructed prediction error and the prediction signal.

The deblocking filter 240 performs a deblocking filter process on the generated local decoded image.

The memory 250 is a memory for storing reference images to be used for motion compensation. Specifically, the memory 250 stores the local decoded image on which the deblocking filter process has been performed.

The intra prediction unit 260 generates a prediction signal (an intra prediction signal) by performing intra prediction. Specifically, the intra prediction unit 260 performs the intra prediction with reference to an image around a coding target block (an input signal) in the local decoded image generated by the adder 235, to thereby generate the intra prediction signal.

The motion estimation unit 270 estimates motion data (for example, a motion vector) between the input signal and the reference image stored in the memory 250.

The motion compensation unit 280 generates a prediction signal (an inter prediction signal) by performing motion compensation based on the estimated motion data.

The intra-inter switch 290 selects one of the intra prediction signal and the inter prediction signal, and outputs the selected signal as the prediction signal to the subtractor 205 and the adder 235.

With the above structure, the image coding apparatus 200 according to Embodiment 1 of the present invention compresses and codes the image data.

It is to be noted that, in FIG. 10, the arithmetic coding unit 100 according to Embodiment 1 of the present invention is included in the entropy coding unit 220. This means that the arithmetic coding unit 100 performs binarization and arithmetic coding on the quantized coefficient as the input signal SI. The signal type information SE is information which indicates the coefficient position of the quantized coefficient, the motion data shown in FIG. 10, or the direction of intra prediction used by the intra prediction unit 260 or the like.

As above, according to the image coding apparatus and the image coding method according to Embodiment 1 of the present invention, it is possible to appropriately determine a context associated with the type of the current signal to be coded according to the frequency component of the quantized coefficient, and to calculate coding probability information item used in the arithmetic coding.

Furthermore, even when the image coding apparatus switches a method for appropriately segmenting a group according to the type of the current signal to be coded, the image decoding apparatus can figure out the correspondence between the group and the context from the mapping information to which a bitstream is added.

With these, since the number of contexts is reduced and the probability information item reflecting the whole statistical information can be used as coding probability information item, the coding efficiency can be increased. In other words, it is possible to increase the coding efficiency while reducing the size of memory for storing for each of the contexts.

It is to be noted that although in the above described embodiment, the mapping information shown in FIG. 3 is coded and the coded mapping information is added to a bitstream, the mapping information may be information which can reconstruct the correspondence relationship between the group and the context.

Embodiment 2

Next, an outline of an arithmetic decoding method according to Embodiment 2 of the present invention will be described. In the image decoding method in the present embodiment, coded image data that has been coded in the image coding method according to Embodiment 1 is decoded. Specifically, context table reconstruction information (mapping information) is extracted from a coded stream. Next, using the reconstructed context table, a context corresponding to a predetermined information type is set. Then, using the set context, arithmetic decoding is performed on the predetermined information type.

Figure 11:
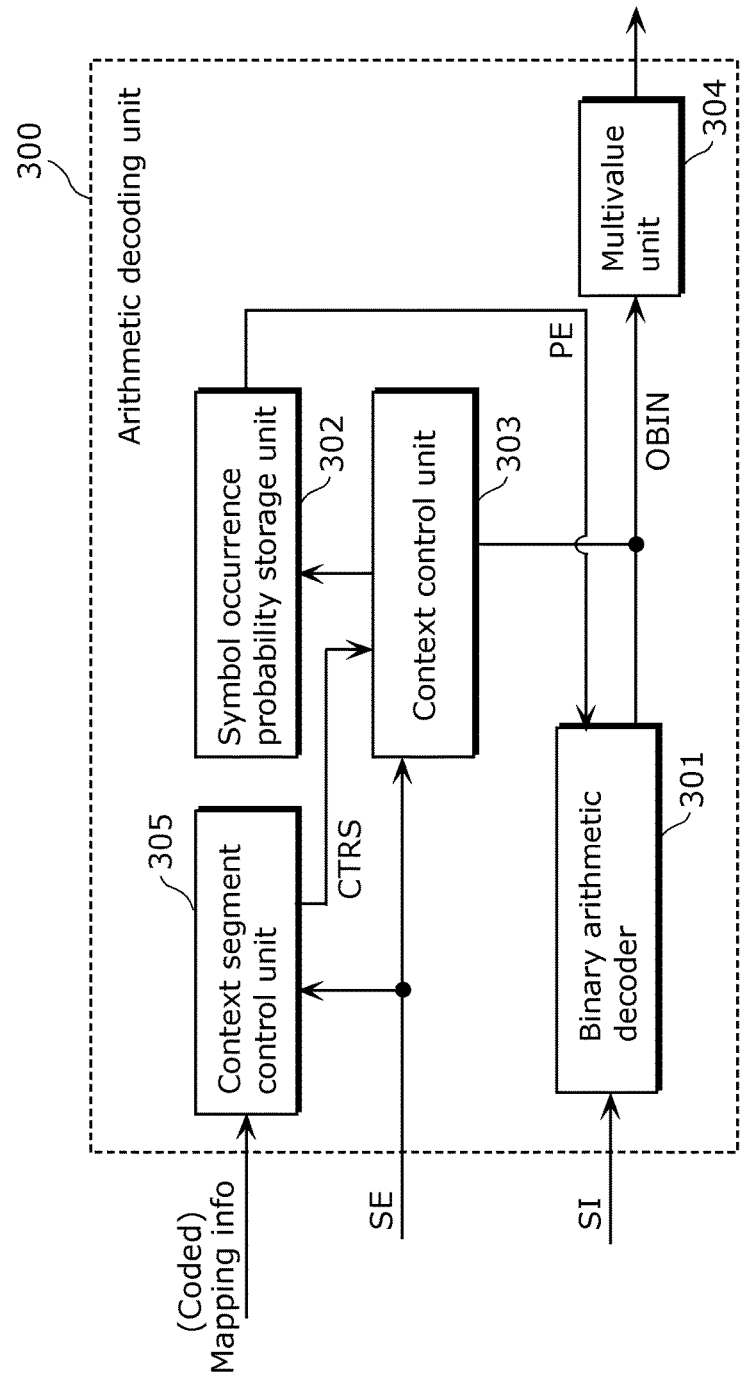
FIG. 11 is a block diagram showing a structure of an arithmetic decoding unit according to Embodiment 2 of the present invention.

Next, a structure of an arithmetic decoding unit according to the present embodiment is described. FIG. 11 is a block diagram showing an example of the structure of an arithmetic decoding unit 300 according to Embodiment 2 of the present invention. As will be described later, the arithmetic decoding unit 300 according to Embodiment 2 of the present invention corresponds to part of an image decoding apparatus which decodes compressed and coded image data.

As shown in FIG. 11, the arithmetic decoding unit 300 includes a binary arithmetic decoder 301, a symbol occurrence probability storage unit 302, a context control unit 303, a multivalue unit 304, and a context segment control unit 305.

The arithmetic decoding unit 300 performs arithmetic decoding on an input stream IS that is the current signal to be decoded, to reconstruct image data and to output the reconstructed image data. Furthermore, the arithmetic decoding unit 300 receives signal type information SE indicating a type of the input stream IS and mapping information (mapping Info) coded in Embodiment 1.

The input stream IS is coded image data (the current signal to be decoded) and is, for example, a signal which indicates a quantized coefficient generated by compressing and coding image data. Specifically, the input stream IS corresponds to a signal generated by performing the arithmetic coding on the input signal SI according to Embodiment 1.

The signal type information SE is an example of type information on the current signal to be decoded. Specifically, the signal type information SE is information indicating a type of the input stream IS. More specifically, the signal type information SE is information similar to the signal type information SE according to Embodiment 1. In other words, in the case where the input stream IS is a signal involving a transform coefficient (for example, a quantized coefficient), the signal type information SE includes position information indicating a position of the transform coefficient (a coefficient position) within the unit of processing.

The binary arithmetic decoder 301 generates a binary signal by performing arithmetic decoding on the current signal to be decoded using a decoding probability information item (symbol occurrence probability). Specifically, the binary arithmetic decoder 301 generates an output binary signal OBIN by performing the arithmetic decoding on the input stream IS, using the symbol occurrence probability outputted by the symbol occurrence probability storage unit 302.

The symbol occurrence probability storage unit 302 is a memory or the like which holds a plurality of symbol occurrence probabilities. For example, the symbol occurrence probability storage unit 302 holds a symbol occurrence probability table. The symbol occurrence probability table is a table in which contexts and probability information items are associated. The symbol occurrence probability table is, for example, the table shown in FIG. 4. The details of the symbol occurrence probability table are similar to those in Embodiment 1.

Furthermore, the symbol occurrence probability storage unit 302 holds a context table designated by the coded mapping information. The context table is a table in which types of the current signal to be decoded and contexts are associated, and is, for example, the table shown in FIG. 5. The details of the context table are similar to those in Embodiment 1.

The context control unit 303 determines a context corresponding to the type of the current signal to be decoded, based on coded mapping information (mapping Info). Specifically, first, the context control unit 303 obtains the signal type information SE and also obtains the control signal CTRS from the context segment control unit 305. The context control unit 303 then determines a context for the current signal to be decoded by referring to the context table, based on (i) the signal type information SE indicating the type of the obtained input stream IS and (ii) the control signal CTRS.

At this time, the context control unit 303 determines a context, based on the group designated by the control signal CTRS. Here, in the case where one group includes a plurality of coefficients, the context control unit 303 determines a context common to these coefficients.

It is to be noted that the context control unit 303 may hold the context table. An operation of the context segment control unit 305 will be described later.

Furthermore, the context control unit 303 determines the decoding probability information item which corresponds to the determined context. Specifically, by referring to the symbol occurrence probability table, the context control unit 303 determines which one of the plurality of symbol occurrence probabilities stored in the symbol occurrence probability storage unit 302 is to be used.

The decoding probability information item is a probability information item to be used in the arithmetic decoding of the binary signal obtained by the arithmetic coding. Specifically, the decoding probability information item indicates an index indicating a value of the symbol occurrence probability or indicates a value of the symbol occurrence probability, for example. Hereinafter, the decoding probability information item is also referred to simply as a probability information item.

The context control unit 303 reads a symbol occurrence probability corresponding to the determined context from the symbol occurrence probability storage unit 302, and outputs the symbol occurrence probability to the binary arithmetic decoder 301. It should be noted that a specific operation of the context control unit 303 is similar to that of the context control unit 103 according to Embodiment 1.

The multivalue unit 304 reconstructs the image data by converting, into multi-values, the output binary signal OBIN generated by the binary arithmetic decoder 301. A method of conversion into multi-values is determined based on the signal type information SE.

The above is a description about the structure of the arithmetic decoding unit 300 according to this embodiment.

Figure 12:
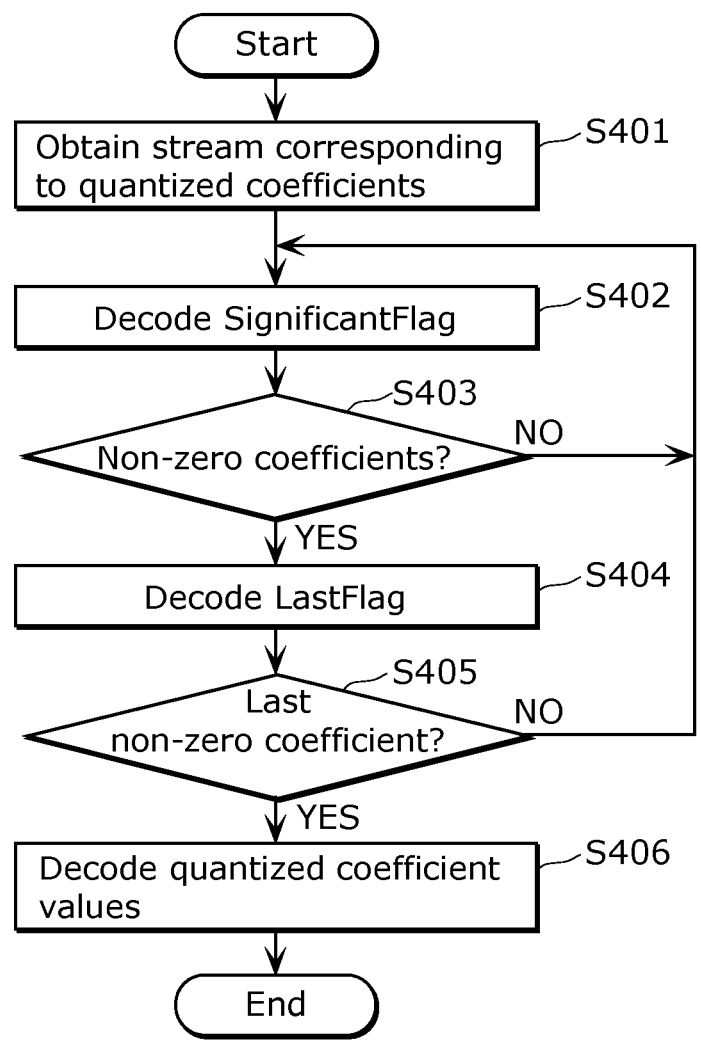
FIG. 12 is a flowchart showing an example of an arithmetic decoding method according to Embodiment 2 of the present invention.

Next, the arithmetic decoding method which the arithmetic decoding unit 300 shown in FIG. 11 performs is described with reference to the flowcharts shown in FIGS. 12 and 13. FIG. 12 is a flowchart showing an example of the arithmetic decoding method according to Embodiment 2 of the present invention. Furthermore, FIG. 12 shows arithmetic decoding in the case where the current signal to be decoded forms a quantized coefficient group which corresponds to one block, and information on whether a coefficient in the quantized coefficient group corresponding to the one block is zero or non-zero is decoded.

As shown in FIG. 12, the arithmetic decoding unit 300 first obtains the input stream IS that is to be decoded (S401). Specifically, the input stream IS includes coded quantized coefficients scanned in a predetermined scan order. In such a case, the input stream IS includes a coded binary signal which expresses, as "0" or "1", whether the quantized coefficient is not zero (a non-zero coefficient) and the quantized coefficient is zero (a zero coefficient). A signal indicating whether this quantized coefficient is a non-zero coefficient is referred to as SignificantFlag.

Here, in the case where the quantized coefficient is a non-zero coefficient, the coded binary signal expresses, as "0" or "1", whether or not there is still a non-zero coefficient, following the non-zero coefficient in the above-mentioned scan order. Here, this binary signal is referred to as LastFlag. This LastFlag is information indicating the position of the last non-zero coefficient in scan order. A case of decoding the signal coded in the method as above is described.

Next, the arithmetic decoding unit 300 performs arithmetic decoding on SignificantFlag (S402). The arithmetic decoding may be the same method as that in H.264, for example. Next, the arithmetic decoding unit 300 determines whether or not the decoded signal is a zero coefficient (S403).

When the decoded signal indicates a zero coefficient (NO in S403), the arithmetic decoding unit 300 performs processing on next SignificantFlag. On the other hand, when the decoded signal indicates that the decoding target coefficient is a non-zero coefficient (YES in S403), the arithmetic decoding unit 300 performs arithmetic decoding on LastFlag that indicates whether this non-zero coefficient is the last non-zero coefficient in scan order (S404). Details of the arithmetic decoding will be described later.

Next, the arithmetic decoding unit 300 determines whether or not the decoded target coefficient is the last non-zero coefficient (S405). Here, when the decoded signal indicates that the decoding target coefficient is not the last non-zero coefficient in scan order (NO in S405), the arithmetic decoding unit 300 performs processing on next SignificantFlag. On the other hand, when the decoded signal indicates that the decoding target coefficient is the last non-zero coefficient in scan order (YES in S405), the arithmetic decoding unit 300 decodes the information of a coefficient value of the non-zero coefficient (coefficient level) (S406). Here, a method for the decoding on the coefficient level of the non-zero coefficient is the same method as that in H.264, for example.

Figure 13:
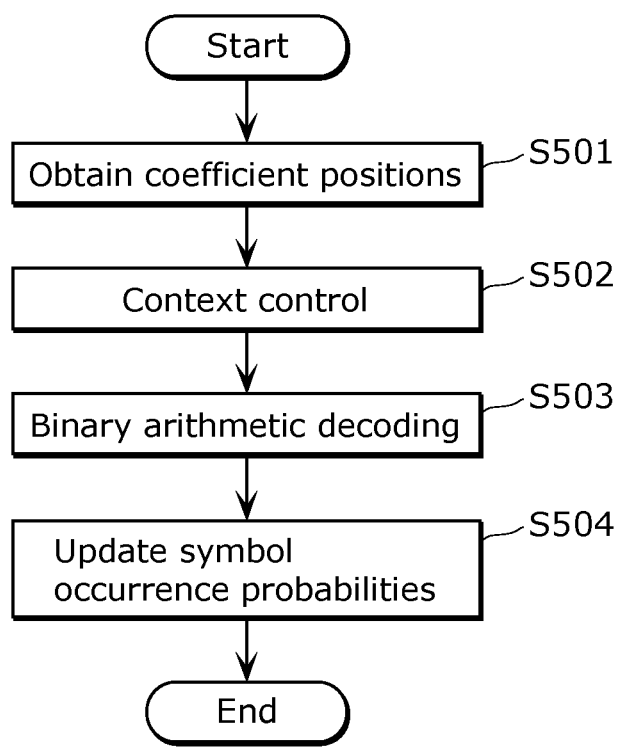
FIG. 13 is a flowchart showing an example of an arithmetic decoding method according to Embodiment 2 of the present invention.

Furthermore, FIG. 13 shows arithmetic decoding of the current signal to be decoded.

In the arithmetic decoding method in FIG. 13, first, a block including a current signal to be decoded that is part of the coded image data is segmented into groups corresponding to a frequency component range according to a type of the current signal, and a context corresponding to each of the groups (S501, S502) is determined. Next, binary arithmetic decoding is performed on the current signal according to a probability information item corresponding to the context, to generate binarized coefficients, the context being corresponding to the group having the current signal (S503). Then, updating is performed on, for each of probability information items, the probability information item corresponding to the context, based on the coefficient included in the group corresponding to the context (S504).

For example, an example of the case where a value of the above described LastFlag as the current signal is decoded is described. Specifically, as shown in FIG. 13, in the arithmetic decoding method according to the present embodiment, the context segment control unit 305 first obtains the signal type information SE including the position information (S501).

Next, the context segment control unit 305 determines in which one of groups the coefficient is included, based on the obtained position information, and thereafter outputs the control signal CTRS indicating the determined group. The context control unit 303 selects, as a context which corresponds to the current signal to be decoded, a context which corresponds to a group indicated by the control signal CTRS obtained from the context segment control unit 305 (S502). In other words, the context control unit 303 selects a context for performing arithmetic decoding on the current signal from among the plurality of contexts stored in the symbol occurrence probability storage unit 302.

Next, the symbol occurrence probability storage unit 302 reads the symbol occurrence probability which corresponds to the context determined by the context control unit 303, and outputs the symbol occurrence probability to the binary arithmetic decoder 301.

The binary arithmetic decoder 301 generates an output binary signal OBIN by performing the arithmetic decoding on the current signal to be decoded using the decoding probability information item (symbol occurrence probability) (S503). Specifically, the binary arithmetic decoder 301 performs the arithmetic decoding on the current signal to be decoded by the method specified in the H.264 standard, using the symbol occurrence probability outputted from the symbol occurrence probability storage unit 302.

Details of the operations of the context segment control unit 305 and the context control unit 303 are similar to the context control performed in the coding according to Embodiment 1.

The context control unit 303 updates the probability information item based on the output binary signal OBIN (S504). Specifically, according to the output binary signal OBIN generated by the binary arithmetic decoder 301, the context control unit 303 updates the symbol occurrence probability which corresponds to the context of the current signal to be decoded. An updating method is similar to the method applied in Embodiment 1.

The multivalue unit 304 reconstructs the image data by converting, into multi-values, the output binary signal OBIN.

By adopting the above method, it becomes possible to decode the signal coded with the increased coding efficiency.

It is to be noted that the arithmetic decoding unit 300 according to Embodiment 2 of the present invention is included in an image decoding apparatus which decodes coded image data on which compression coding is performed. FIG. 14 is a block diagram showing an example of a structure of an image decoding apparatus 400 according to Embodiment 2 of the present invention.

The image decoding apparatus 400 decodes compressed and coded image data. For example, the image decoding apparatus 400 receives, for each block, the coded image data as the current signal to be decoded. The image decoding apparatus 400 performs variable length decoding, inverse quantization, and inverse transformation on the received current signal to be decoded, to reconstruct the image data.

As shown in FIG. 14, the image decoding apparatus 400 includes an entropy decoding unit 410, an inverse quantization and inverse transformation unit 420, an adder 425, a deblocking filter 430, a memory 440, an intra prediction unit 450, a motion compensation unit 460, and an intra-inter switch 470.

The entropy decoding unit 410 performs the variable length decoding on the input signal (the input stream) to reconstruct the quantized coefficient. Here, the input signal (the input stream) is the current signal to be decoded and corresponds to data of each block of the coded image data. Furthermore, the entropy decoding unit 410 obtains motion data from the input signal, and outputs the obtained motion data to the motion compensation unit 460.

The inverse quantization and inverse transformation unit 420 reconstructs the transform coefficient by inversely quantizing the quantized coefficient reconstructed by the entropy decoding unit 410. Furthermore, the inverse quantization and inverse transformation unit 420 reconstructs the prediction error by inversely transforming the reconstructed transform coefficient.

The adder 425 generates a decoded image by adding the reconstructed prediction error and the prediction signal.

The deblocking filter 430 performs deblocking filter process on the generated decoded image. The decoded image on which the deblocking filter process has been performed is outputted as a decoded signal.

The memory 440 is a memory for storing a reference image to be used for motion compensation. Specifically, the memory 440 stores the decoded image on which the deblocking filter process has been performed.

The intra prediction unit 450 generates a prediction signal (an intra prediction signal) by performing intra prediction. Specifically, the intra prediction unit 450 performs the intra prediction with reference to an image around the decoding target block (the input signal) in the decoded image generated by the adder 425, to thereby generate the intra prediction signal.

The motion compensation unit 460 generates a prediction signal (an inter prediction signal) by performing motion compensation based on the motion data outputted from the entropy decoding unit 410.

The intra-inter switch 470 selects one of the intra prediction signal and the inter prediction signal, and outputs the selected signal as the prediction signal to the adder 425.

With the above structure, the image decoding apparatus 400 according to Embodiment 2 of the present invention decodes coded image data on which compression coding has been performed.

It is to be noted that, in FIG. 14, the arithmetic decoding unit 300 according to Embodiment 2 of the present invention is included in the entropy decoding unit 410. This means that the arithmetic decoding unit 300 performs the arithmetic decoding and multivalue conversion on the coded image data, in the form of the input stream IS, on which the prediction coding has been executed. The signal type information SE is information which indicates the position of the quantized coefficient, the motion data, the direction of intra prediction used by the intra prediction unit 450, or the like.

It goes without saying that the information for reconstructing the context table shown in FIG. 3 is obtained for each unit to be coded by the coding apparatus. For example, in the case where a coded stream includes the information of units corresponding to slices and pictures on the coding side, the information is obtained by this unit.

As described above, according to the image decoding apparatus and the image decoding method according to Embodiment 2 of the present invention, an appropriate context is determined according to the frequency component of the quantized coefficient and the decoding probability information item used in the arithmetic coding is obtained. Specifically, the correspondence relationship between the information type and the context is obtained from the coded mapping information.

With this, it is possible to accurately decode a signal with increased coding efficiency. Specifically, as shown in Embodiment 1, the current signal to be decoded can be grouped in the form having a statistical balance according to the frequency component of the quantized coefficient. With these, since the number of contexts is reduced and the probability information item reflecting the appropriate statistical information can be used as a decoding probability information item, the coding efficiency can be increased.

The image decoding apparatus and the image decoding method according to Embodiment 2 can accurately decode a signal with the increased coding efficiency.

Embodiment 3

In a coding method according to Embodiment 3, a group is determined for each setting unit of a predetermined controlling parameter, as a group of information type in the coding method according to Embodiment 1.

Figure 15:
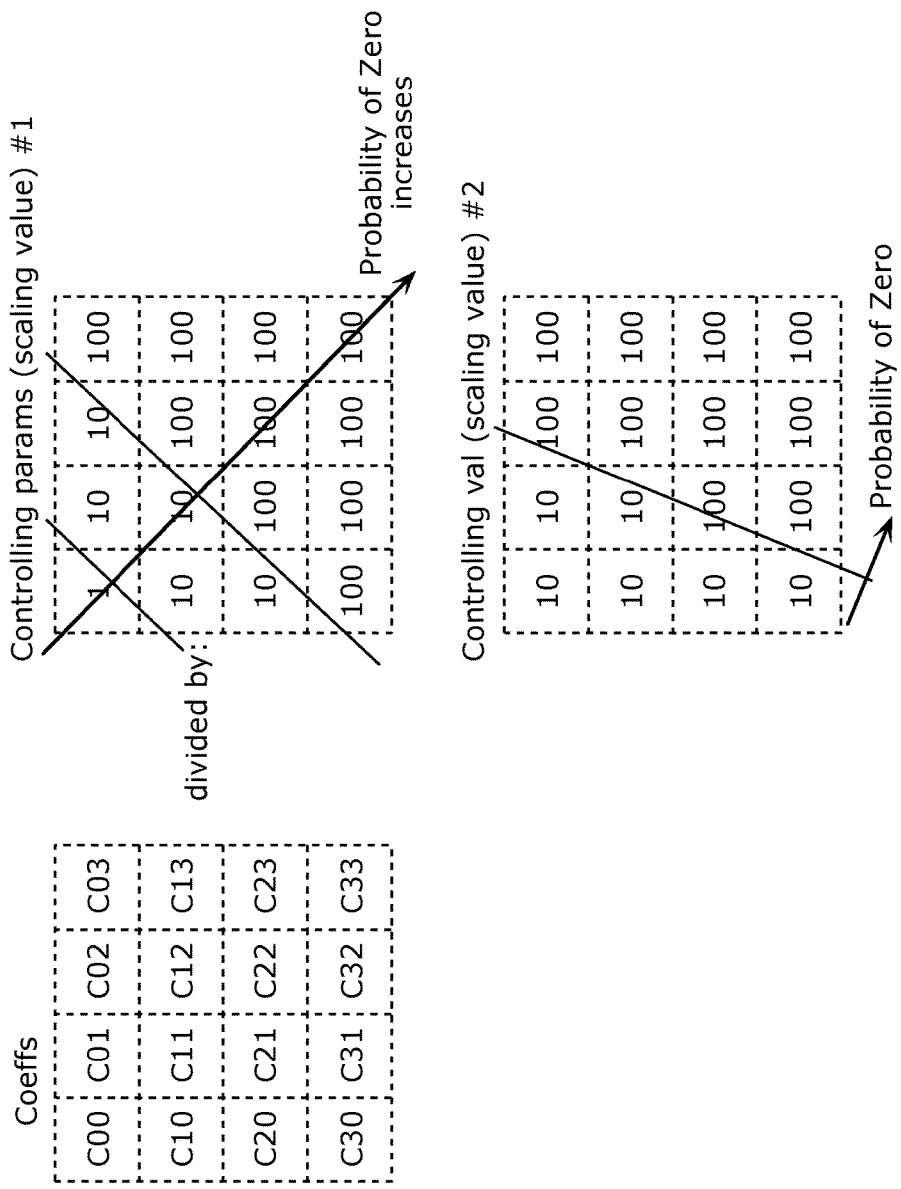
FIG. 15 is a diagram showing a concept of a coding method according to Embodiment 3 of the present invention.

FIG. 15 is a diagram for conceptually explaining the meaning in which a group of information type is segmented corresponding to the allocation of controlling parameters (or parameter values).

In FIG. 15, C00 to C33 indicates 16 frequency coefficients (Coeffs) that are examples of information types. Moreover, in FIG. 15, Controlling params#1 is an example of allocation of controlling parameters. Here, the controlling parameters are values for quantizing C00 to C33 (values dividing the frequency coefficients).

For example, C00 is divided by a value 1, and C10, C01, C02, C20, and C22 are divided by a value 10, and the remaining frequency coefficients are divided by a value 100. Therefore, C00 is segmented as a group, and the remaining frequency coefficients C10, C01, C02, C20, and C22 are segmented as a group.

In the case of the allocation of such controlling parameters, the probability that the division result becomes a predetermined value is affected by the allocation of controlling parameters. For example, a coefficient located in the lower right triangle has a higher probability than other coefficients that the coefficient becomes zero.

Moreover, Controlling params#2 is the second example of allocation of controlling parameters. In this example, C00, C10, C20, C30, C01, C11 are quantized (divided) with a value 10, and the other frequency coefficients are quantized with a value 100. Also in this case, C00, C10, C20, C30, C01, and C11 are segmented as a group, and the remaining frequency coefficients are segmented as another group. The application of a common context to each of the groups can generate an effect in terms of a reduction in the number of contexts (an increase in the frequency of being selected).

Figure 16:
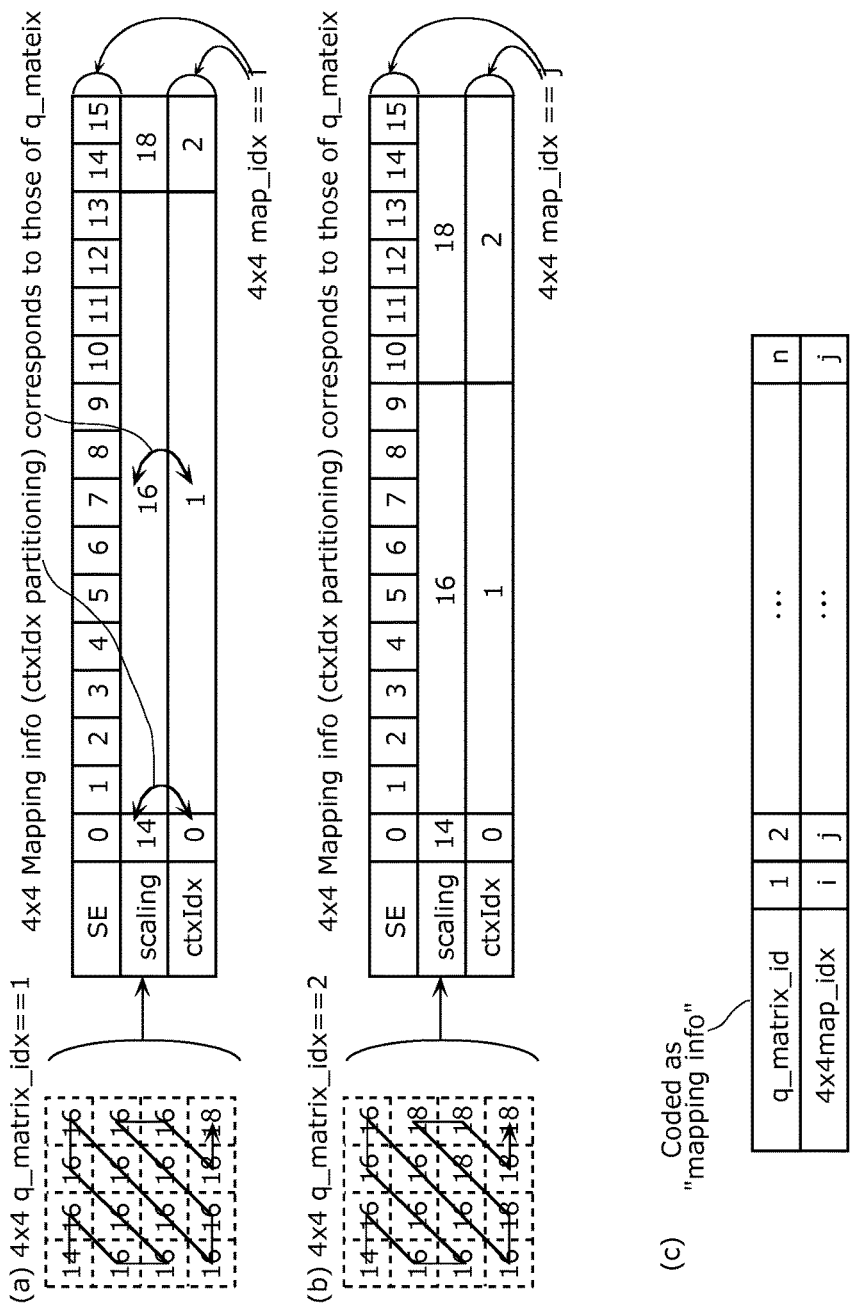
FIG. 16 is a diagram showing a correspondence relationship between a controlling parameter and mapping information shown in FIG. 5.

FIG. 16 is a diagram showing an example of context mapping information corresponding to quantized matrix as an example of a controlling parameter.

(a) in FIG. 16 shows the first quantization matrix (q_matrix_idex==1) and the mapping information corresponding to the matrix. An arrow in the drawing indicates an example of the scan order of quantized coefficients. The first quantization matrix is applied, as a value for quantization, to coefficients of the location corresponding to 14, 16, and 18. Specifically, 14 is applied to the coefficient in the first scan order (SE=0), 16 is applied to the coefficients in the second to 14th scan order (SE=1 to 13), and 18 is applied to the other coefficients.

The context segment control unit 105 (or the context control unit 103) in FIG. 3 determines one mapping information item (correspondence between CtxIdx and SE) which is associated with the first quantization matrix (or the index designating the first quantization matrix). In this example, the mapping information indicated by 4×4mapIdx==i is used.

(b) in FIG. 16 shows the second quantization matrix (q_matrix_idex==2) and the mapping information corresponding to the matrix. The difference of (b) in FIG. 16 from (a) in FIG. 16 is the boundary of group of information types SE to which the values for quantization 14, 16, and 18 are applied.

Furthermore, (c) in FIG. 16 shows mapping information outputted by the entropy coding unit according to the present embodiment. The mapping information according to the present embodiment is indicated by a pair of the quantization matrix to be applied and the corresponding mapping information, and the mapping information is added to a bitstream.

The decoding apparatus according to Embodiment 2, based on the mapping information, obtains an identifier for identifying the mapping information (4×4mapIdx) from a quantization matrix identifier (q_matrix_id) for reconstructing the quantized coefficient to be decoded, and identifies the context for the arithmetic decoding.

As described above, according to the coding method in the present embodiment, the mapping information indicating the correspondence relationship between the group of information types and the contexts is determined in association with the quantization matrix.

As described above, since the mapping information is coded in association with the predetermined control information, the effectiveness of the context to be applied to each group is maintained while the coding quantity for coding the mapping information can be reduced.

It is to be noted that although in the above described example, the mapping information stored in advance is derived from the identifier of the mapping information, the mapping information associated with the predetermined quantization matrix may be coded. It is to be noted that the information for identifying the quantization matrix includes a quantization matrix (scaling matrix), a quantization offset (offset value), a quantization matrix index, and the like, any one of which can be applied as the information for identifying the quantization matrix.

Although the quantization matrix is described as an example of the controlling parameter, the controlling parameter (group, the location of value) influencing a group to which a common context is applied can generate an effect.

Figure 17:
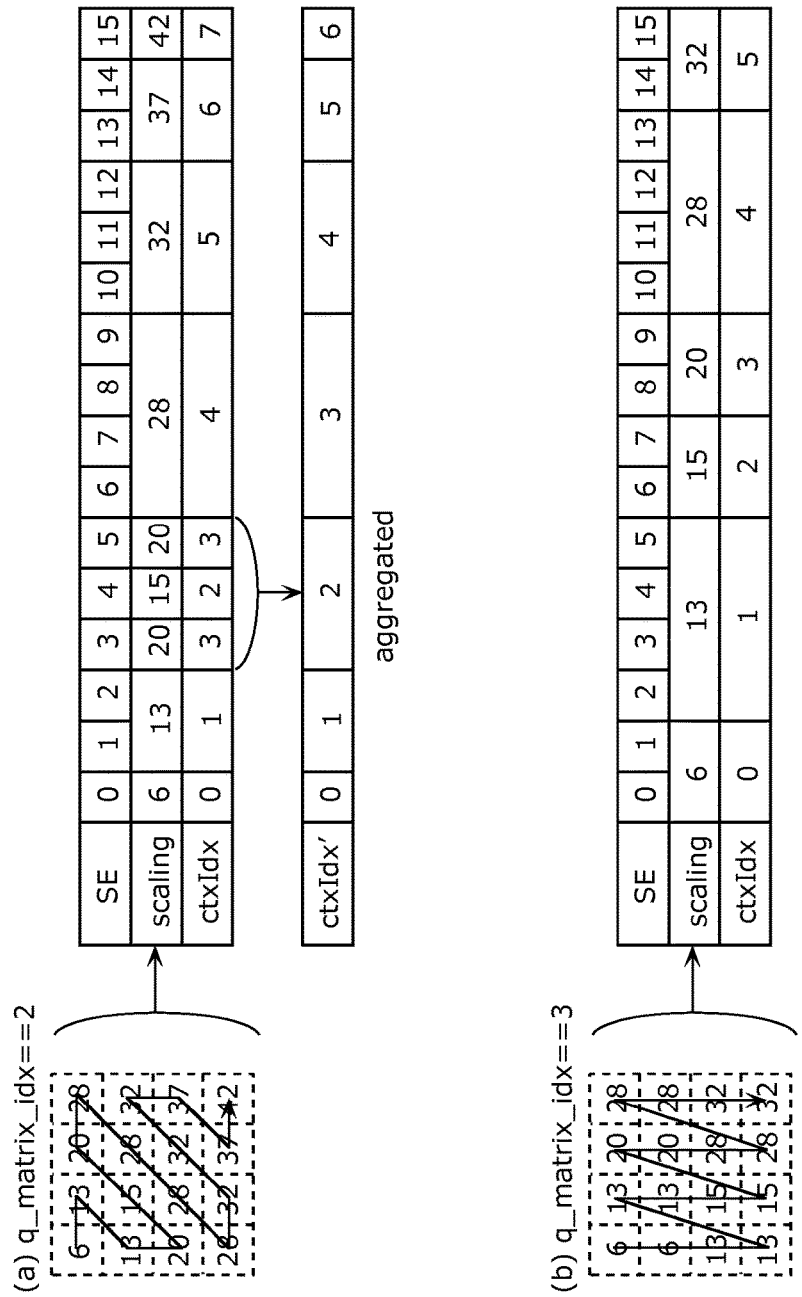
FIG. 17 is a diagram showing another example of expression of mapping information according to Embodiment 3 of the present invention.

Moreover, the group of quantization parameters and the group to which a common context is applied (the group to which common CtxIdx is applied) do not have to be a one-to-one correspondence. For example, (a) of FIG. 17 shows the case where three information types SE to which quantization parameters 20, 15, 20 are applied are integrated and one context CtxIDX is applied.

Moreover, in the case where the information type SE is the quantization matrix, the table showing a correspondence relationship between the information type identifier and the mapping information may change the sequence according to scan order. For example, (b) in FIG. 17 is a diagram showing that when a coefficient is coded in scan order different from the usual scan order, a sequence of columns of SE and CtxIdx in the mapping information is determined according to scan order. When the sequence is rearranged, the same value is successively applied to CtxIdx, with the result that the coding quantity of the mapping information itself can be reduced.

Embodiment 4

The processing described in each of embodiments can be simply implemented in an independent computer system, by recording, in a recording medium, a program for implementing the configurations of the moving picture coding method (image coding method) and the moving picture decoding method (image decoding method) described in each of embodiments. The recording media may be any recording media as long as the program can be recorded, such as a magnetic disk, an optical disk, a magnetic optical disk, an IC card, and a semiconductor memory.

Hereinafter, the applications to the moving picture coding method (image coding method) and the moving picture decoding method (image decoding method) described in each of embodiments and systems using thereof will be described. The system has a feature of having an image coding and decoding apparatus that includes an image coding apparatus using the image coding method and an image decoding apparatus using the image decoding method. Other configurations in the system can be changed as appropriate depending on the cases.

Figure 18:
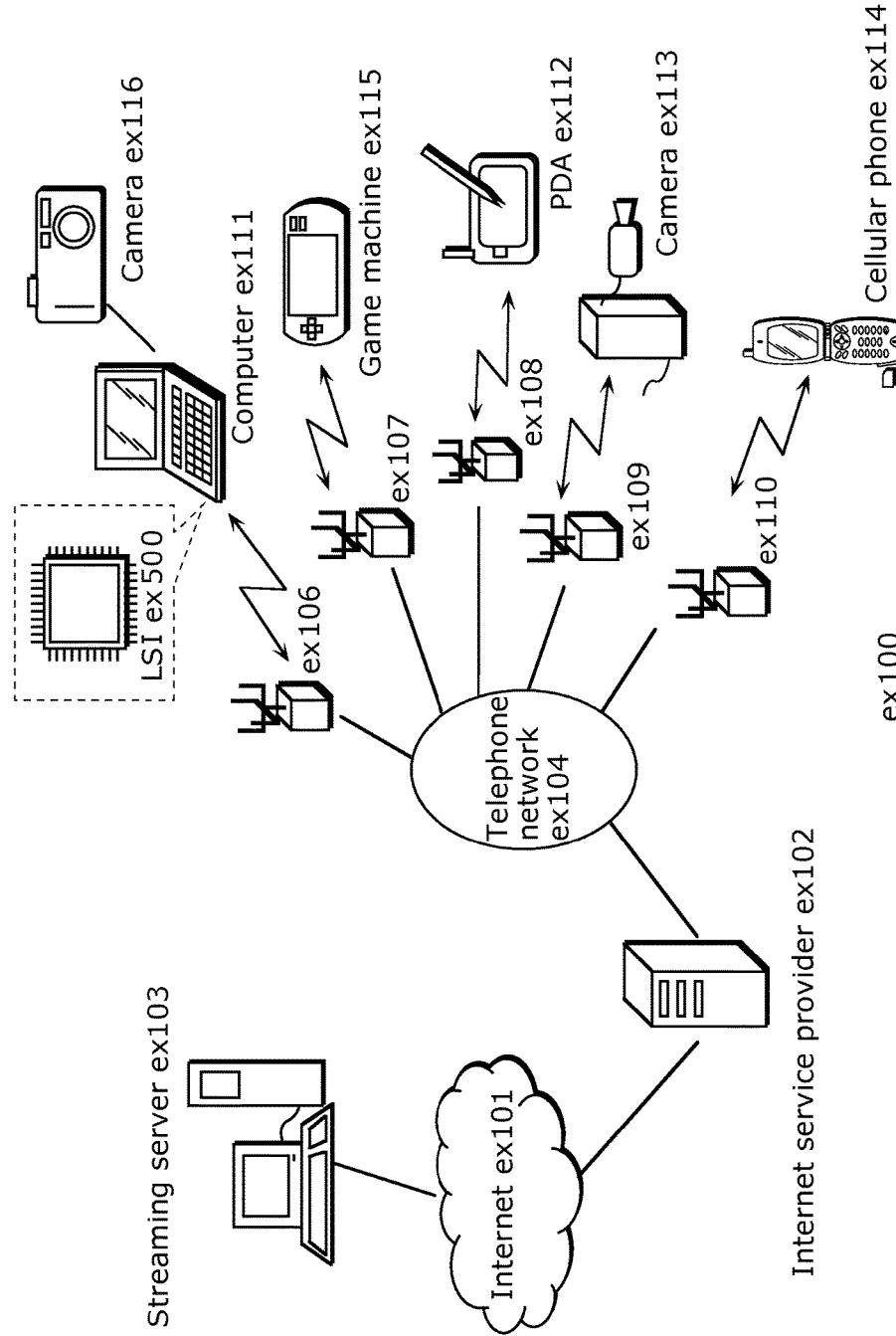
FIG. 18 illustrates an overall configuration of a content providing system for implementing content distribution services.

FIG. 18 illustrates an overall configuration of a content providing system ex100 for implementing content distribution services. The area for providing communication services is divided into cells of desired size, and base stations ex106, ex107, ex108, ex109, and ex110 which are fixed wireless stations are placed in each of the cells.

The content providing system ex100 is connected to devices, such as a computer ex111, a personal digital assistant (PDA) ex112, a camera ex113, a cellular phone ex114 and a game machine ex115, via the Internet ex101, an Internet service provider ex102, a telephone network ex104, as well as the base stations ex106 to ex110, respectively.

However, the configuration of the content providing system ex100 is not limited to the configuration shown in FIG. 18, and a combination in which any of the elements are connected is acceptable. In addition, each device may be directly connected to the telephone network ex104, rather than via the base stations ex106 to ex110 which are the fixed wireless stations. Furthermore, the devices may be interconnected to each other via a short distance wireless communication and others.

The camera ex113, such as a digital video camera, is capable of capturing video. A camera ex116, such as a digital camera, is capable of capturing both still images and video. Furthermore, the cellular phone ex114 may be the one that meets any of the standards such as Global System for Mobile Communications (GSM) (registered trademark), Code Division Multiple Access (CDMA), Wideband-Code Division Multiple Access (W-CDMA), Long Term Evolution (LTE), and High Speed Packet Access (HSPA). Alternatively, the cellular phone ex114 may be a Personal Handyphone System (PHS).

In the content providing system ex100, a streaming server ex103 is connected to the camera ex113 and others via the telephone network ex104 and the base station ex109, which enables distribution of images of a live show and others. In such a distribution, a content (for example, video of a music live show) captured by the user using the camera ex113 is coded as described above in each of embodiments (i.e., the camera functions as the image coding apparatus according to an aspect of the present invention), and the coded content is transmitted to the streaming server ex103. On the other hand, the streaming server ex103 carries out stream distribution of the transmitted content data to the clients upon their requests. The clients include the computer ex111, the PDA ex112, the camera ex113, the cellular phone ex114, and the game machine ex115 that are capable of decoding the above-mentioned coded data. Each of the devices that have received the distributed data decodes and reproduces the coded data (i.e., functions as the image decoding apparatus according to an aspect of the present invention).

The captured data may be coded by the camera ex113 or the streaming server ex103 that transmits the data, or the coding processes may be shared between the camera ex113 and the streaming server ex103. Similarly, the distributed data may be decoded by the clients or the streaming server ex103, or the decoding processes may be shared between the clients and the streaming server ex103. Furthermore, the data of the still images and video captured by not only the camera ex113 but also the camera ex116 may be transmitted to the streaming server ex103 through the computer ex111. The coding processes may be performed by the camera ex116, the computer ex111, or the streaming server ex103, or shared among them.

Furthermore, the coding and decoding processes may be performed by an LSI ex500 generally included in each of the computer ex111 and the devices. The LSI ex500 may be configured of a single chip or a plurality of chips. Software for encoding and decoding video may be integrated into some type of a recording medium (such as a CD-ROM, a flexible disk, and a hard disk) that is readable by the computer ex111 and others, and the coding and decoding processes may be performed using the software. Furthermore, when the cellular phone ex114 is equipped with a camera, the video data obtained by the camera may be transmitted. The video data is data coded by the LSI ex500 included in the cellular phone ex114.

Furthermore, the streaming server ex103 may be composed of servers and computers, and may decentralize data and process the decentralized data, record, or distribute data.

As described above, the clients may receive and reproduce the coded data in the content providing system ex100. In other words, the clients can receive and decode information transmitted by the user, and reproduce the decoded data in real time in the content providing system ex100, so that the user who does not have any particular right and equipment can implement personal broadcasting.

Figure 19:
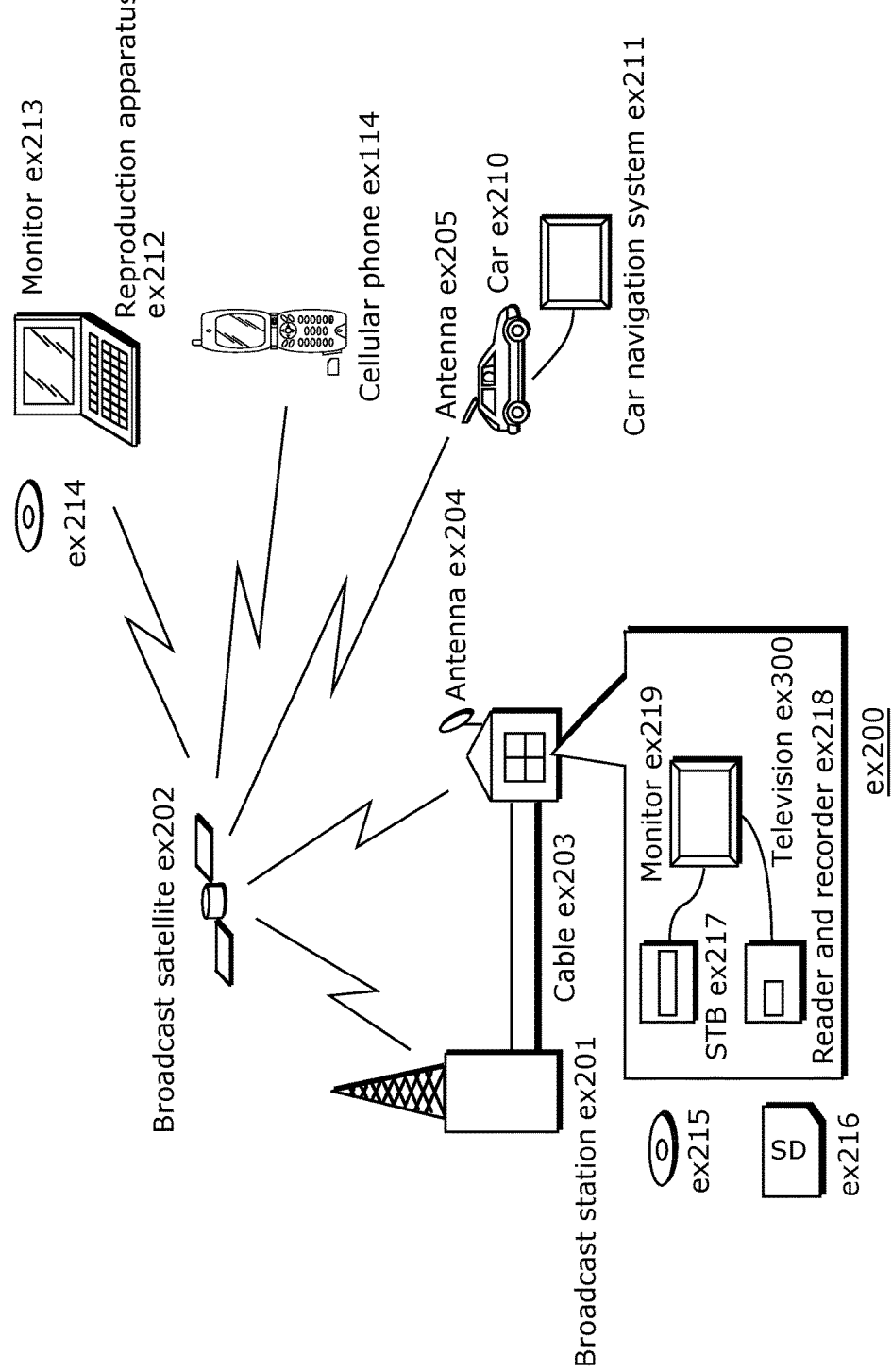
FIG. 19 illustrates an overall configuration of a digital broadcasting system.

Aside from the example of the content providing system ex100, at least one of the moving picture coding apparatus (image coding apparatus) and the moving picture decoding apparatus (image decoding apparatus) described in each of embodiments may be implemented in a digital broadcasting system ex200 illustrated in FIG. 19. More specifically, a broadcast station ex201 communicates or transmits, via radio waves to a broadcast satellite ex202, multiplexed data obtained by multiplexing audio data and others onto video data. The video data is data coded by the moving picture coding method described in each of embodiments (i.e., data coded by the image coding apparatus according to an aspect of the present invention). Upon receipt of the multiplexed data, the broadcast satellite ex202 transmits radio waves for broadcasting. Then, a home-use antenna ex204 with a satellite broadcast reception function receives the radio waves. Next, a device such as a television (receiver) ex300 and a set top box (STB) ex217 decodes the received multiplexed data, and reproduces the decoded data (i.e., functions as the image decoding apparatus according to an aspect of the present invention).

Furthermore, a reader/recorder ex218 (i) reads and decodes the multiplexed data recorded on a recording medium ex215, such as a DVD and a BD, or (i) codes video signals in the recording medium ex215, and in some cases, writes data obtained by multiplexing an audio signal on the coded data. The reader/recorder ex218 can include the moving picture decoding apparatus or the moving picture coding apparatus as shown in each of embodiments. In this case, the reproduced video signals are displayed on the monitor ex219, and can be reproduced by another device or system using the recording medium ex215 on which the multiplexed data is recorded. It is also possible to implement the moving picture decoding apparatus in the set top box ex217 connected to the cable ex203 for a cable television or to the antenna ex204 for satellite and/or terrestrial broadcasting, so as to display the video signals on the monitor ex219 of the television ex300. The moving picture decoding apparatus may be implemented not in the set top box but in the television ex300.

Figure 20:
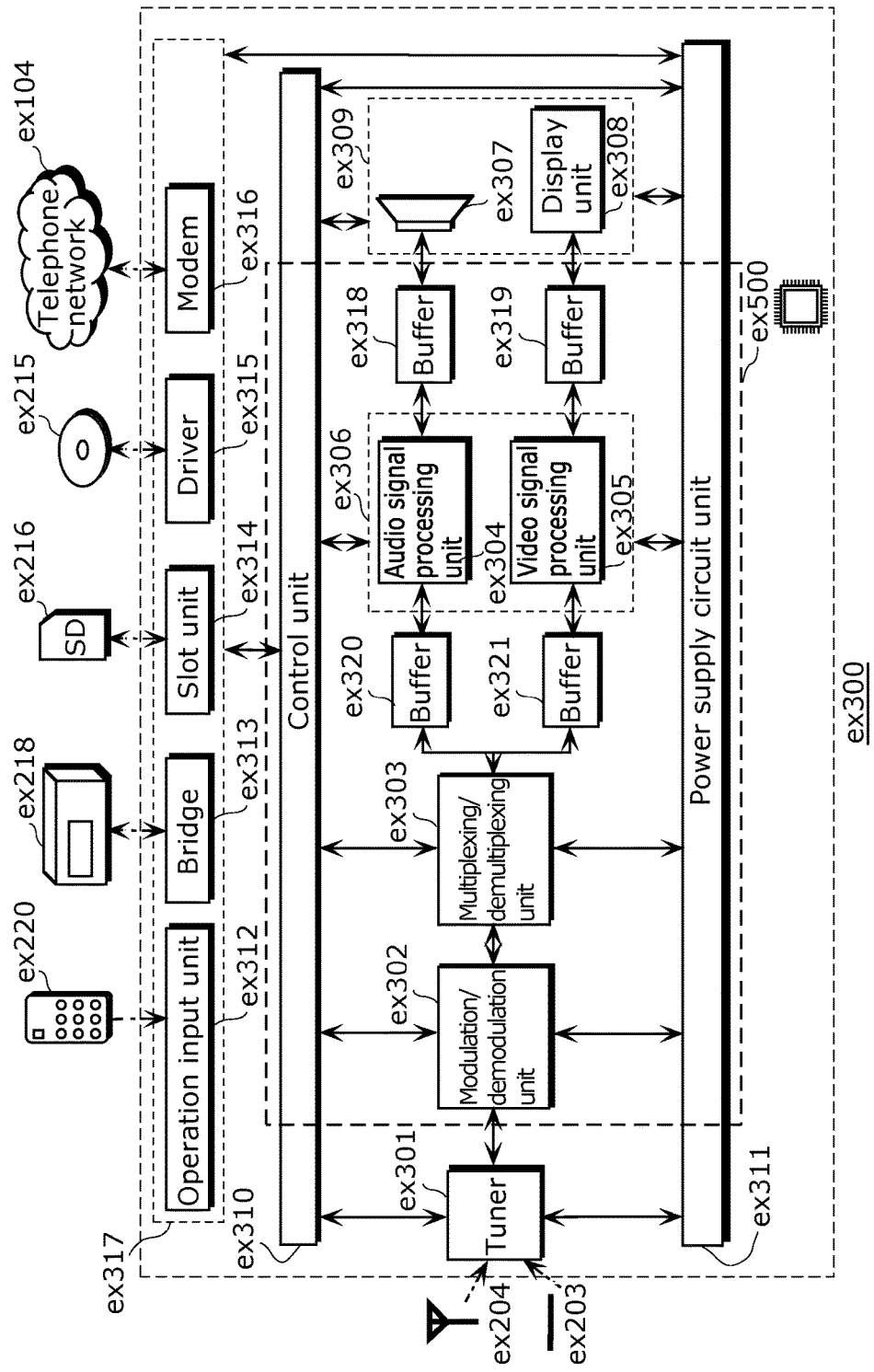
FIG. 20 is a block diagram illustrating an example of a configuration of a television.

FIG. 20 illustrates the television (receiver) ex300 that uses the moving picture coding method and the moving picture decoding method described in each of embodiments. The television ex300 includes: a tuner ex301 that obtains or provides multiplexed data obtained by multiplexing audio data onto video data, through the antenna ex204 or the cable ex203, etc. that receives a broadcast; a modulation/demodulation unit ex302 that demodulates the received multiplexed data or modulates data into multiplexed data to be supplied outside; and a multiplexing/demultiplexing unit ex303 that demultiplexes the modulated multiplexed data into video data and audio data, or multiplexes video data and audio data coded by a signal processing unit ex306 into data.

The television ex300 further includes: a signal processing unit ex306 including an audio signal processing unit ex304 and a video signal processing unit ex305 that decode audio data and video data and code audio data and video data, respectively (which function as the image coding apparatus and the image decoding apparatus according to the aspects of the present invention); and an output unit ex309 including a speaker ex307 that provides the decoded audio signal, and a display unit ex308 that displays the decoded video signal, such as a display. Furthermore, the television ex300 includes an interface unit ex317 including an operation input unit ex312 that receives an input of a user operation. Furthermore, the television ex300 includes a control unit ex310 that controls overall each constituent element of the television ex300, and a power supply circuit unit ex311 that supplies power to each of the elements. Other than the operation input unit ex312, the interface unit ex317 may include: a bridge ex313 that is connected to an external device, such as the reader/recorder ex218; a slot unit ex314 for enabling attachment of the recording medium ex216, such as an SD card; a driver ex315 to be connected to an external recording medium, such as a hard disk; and a modem ex316 to be connected to a telephone network. Here, the recording medium ex216 can electrically record information using a non-volatile/volatile semiconductor memory element for storage. The constituent elements of the television ex300 are connected to each other through a synchronous bus.

First, the configuration in which the television ex300 decodes multiplexed data obtained from outside through the antenna ex204 and others and reproduces the decoded data will be described. In the television ex300, upon a user operation through a remote controller ex220 and others, the multiplexing/demultiplexing unit ex303 demultiplexes the multiplexed data demodulated by the modulation/demodulation unit ex302, under control of the control unit ex310 including a CPU. Furthermore, the audio signal processing unit ex304 decodes the demultiplexed audio data, and the video signal processing unit ex305 decodes the demultiplexed video data, using the decoding method described in each of embodiments, in the television ex300. The output unit ex309 provides the decoded video signal and audio signal outside, respectively. When the output unit ex309 provides the video signal and the audio signal, the signals may be temporarily stored in buffers ex318 and ex319, and others so that the signals are reproduced in synchronization with each other. Furthermore, the television ex300 may read multiplexed data not through a broadcast and others but from the recording media ex215 and ex216, such as a magnetic disk, an optical disk, and a SD card. Next, a configuration in which the television ex300 codes an audio signal and a video signal, and transmits the data outside or writes the data on a recording medium will be described. In the television ex300, upon a user operation through the remote controller ex220 and others, the audio signal processing unit ex304 codes an audio signal, and the video signal processing unit ex305 codes a video signal, under control of the control unit ex310 using the coding method described in each of embodiments. The multiplexing/demultiplexing unit ex303 multiplexes the coded video signal and audio signal, and provides the resulting signal outside. When the multiplexing/demultiplexing unit ex303 multiplexes the video signal and the audio signal, the signals may be temporarily stored in the buffers ex320 and ex321, and others so that the signals are reproduced in synchronization with each other. Here, the buffers ex318, ex319, ex320, and ex321 may be plural as illustrated, or at least one buffer may be shared in the television ex300. Furthermore, data may be stored in a buffer so that the system overflow and underflow may be avoided between the modulation/demodulation unit ex302 and the multiplexing/demultiplexing unit ex303, for example.

Furthermore, the television ex300 may include a configuration for receiving an AV input from a microphone or a camera other than the configuration for obtaining audio and video data from a broadcast or a recording medium, and may code the obtained data. Although the television ex300 can code, multiplex, and provide outside data in the description, it may be capable of only receiving, decoding, and providing outside data but not the coding, multiplexing, and providing outside data.

Furthermore, when the reader/recorder ex218 reads or writes multiplexed data from or on a recording medium, one of the television ex300 and the reader/recorder ex218 may decode or encode the multiplexed data, and the television ex300 and the reader/recorder ex218 may share the decoding or encoding.

Figure 21:
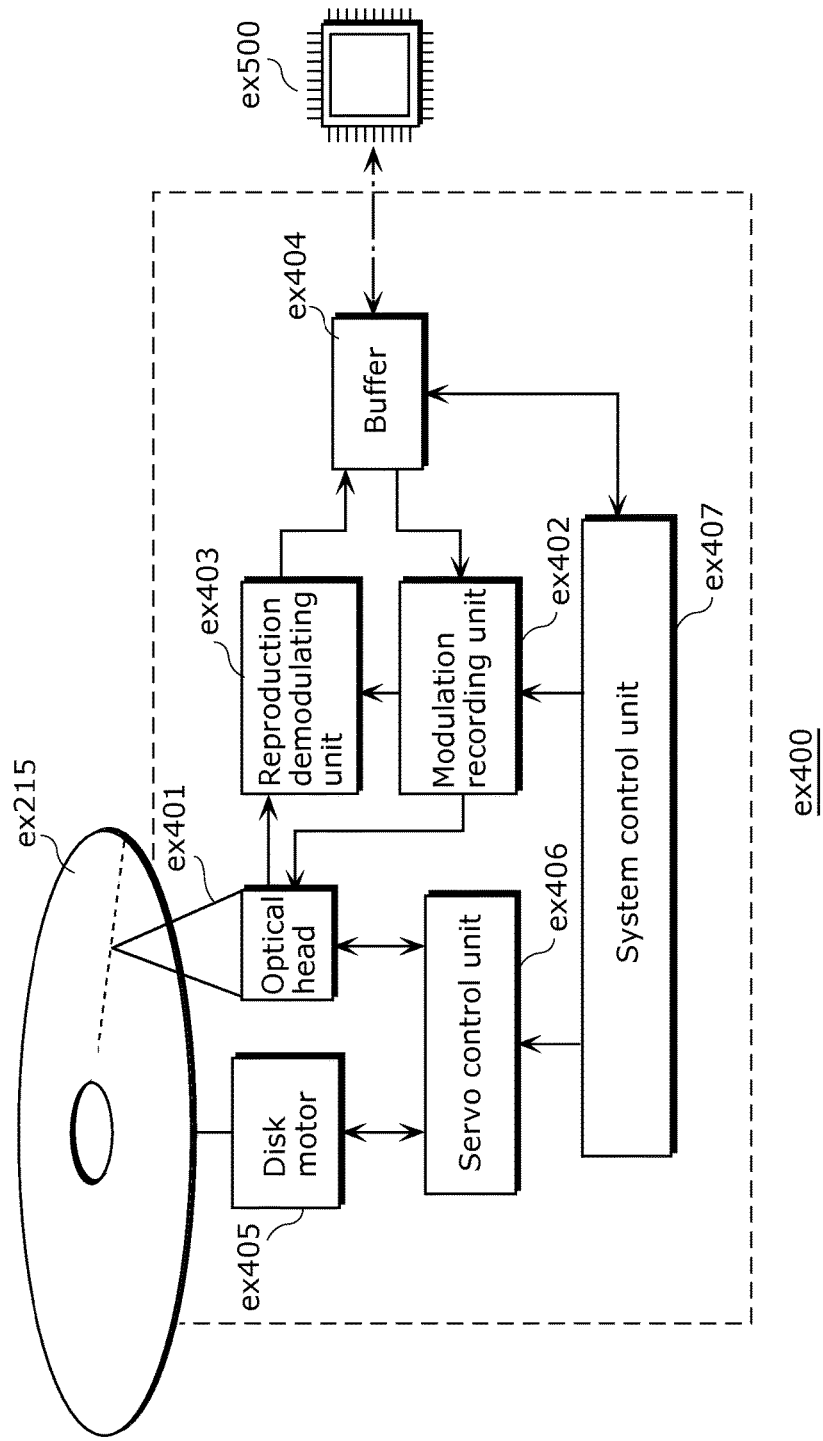
FIG. 21 is a block diagram illustrating an example of a configuration of an information reproducing/recording unit that reads and writes information from and on a recording medium that is an optical disk.

As an example, FIG. 21 illustrates a configuration of an information reproducing/recording unit ex400 when data is read or written from or on an optical disk. The information reproducing/recording unit ex400 includes constituent elements ex401, ex402, ex403, ex404, ex405, ex406, and ex407 to be described hereinafter. The optical head ex401 irradiates a laser spot in a recording surface of the recording medium ex215 that is an optical disk to write information, and detects reflected light from the recording surface of the recording medium ex215 to read the information. The modulation recording unit ex402 electrically drives a semiconductor laser included in the optical head ex401, and modulates the laser light according to recorded data. The reproduction demodulating unit ex403 amplifies a reproduction signal obtained by electrically detecting the reflected light from the recording surface using a photo detector included in the optical head ex401, and demodulates the reproduction signal by separating a signal component recorded on the recording medium ex215 to reproduce the necessary information. The buffer ex404 temporarily holds the information to be recorded on the recording medium ex215 and the information reproduced from the recording medium ex215. The disk motor ex405 rotates the recording medium ex215. The servo control unit ex406 moves the optical head ex401 to a predetermined information track while controlling the rotation drive of the disk motor ex405 so as to follow the laser spot. The system control unit ex407 controls overall the information reproducing/recording unit ex400. The reading and writing processes can be implemented by the system control unit ex407 using various information stored in the buffer ex404 and generating and adding new information as necessary, and by the modulation recording unit ex402, the reproduction demodulating unit ex403, and the servo control unit ex406 that record and reproduce information through the optical head ex401 while being operated in a coordinated manner. The system control unit ex407 includes, for example, a microprocessor, and executes processing by causing a computer to execute a program for read and write.

Although the optical head ex401 irradiates a laser spot in the description, it may perform high-density recording using near field light.

Figure 22:
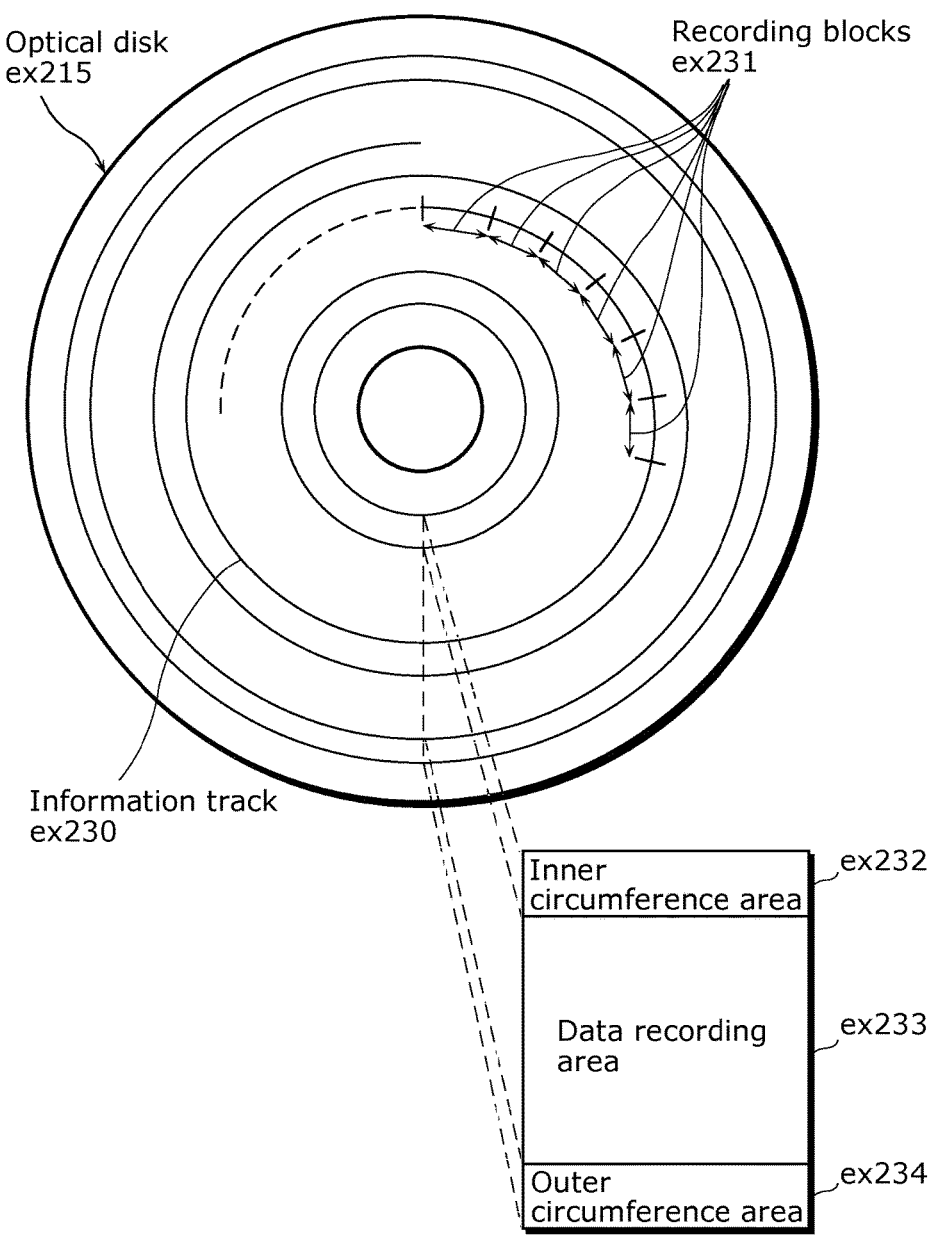
FIG. 22 shows an example of a configuration of a recording medium that is an optical disk.

FIG. 22 illustrates the recording medium ex215 that is the optical disk. On the recording surface of the recording medium ex215, guide grooves are spirally formed, and an information track ex230 records, in advance, address information indicating an absolute position on the disk according to change in a shape of the guide grooves. The address information includes information for determining positions of recording blocks ex231 that are a unit for recording data. Reproducing the information track ex230 and reading the address information in an apparatus that records and reproduces data can lead to determination of the positions of the recording blocks. Furthermore, the recording medium ex215 includes a data recording area ex233, an inner circumference area ex232, and an outer circumference area ex234. The data recording area ex233 is an area for use in recording the user data. The inner circumference area ex232 and the outer circumference area ex234 that are inside and outside of the data recording area ex233, respectively are for specific use except for recording the user data. The information reproducing/recording unit 400 reads and writes coded audio, coded video data, or multiplexed data obtained by multiplexing the coded audio and video data, from and on the data recording area ex233 of the recording medium ex215.

Although an optical disk having a layer, such as a DVD and a BD is described as an example in the description, the optical disk is not limited to such, and may be an optical disk having a multilayer structure and capable of being recorded on a part other than the surface. Furthermore, the optical disk may have a structure for multidimensional recording/reproduction, such as recording of information using light of colors with different wavelengths in the same portion of the optical disk and for recording information having different layers from various angles.

Furthermore, a car ex210 having an antenna ex205 can receive data from the satellite ex202 and others, and reproduce video on a display device such as a car navigation system ex211 set in the car ex210, in the digital broadcasting system ex200. Here, a configuration of the car navigation system ex211 will be a configuration, for example, including a GPS receiving unit from the configuration illustrated in FIG. 20. The same will be true for the configuration of the computer ex111, the cellular phone ex114, and others.

(a) in FIG. 23 illustrates the cellular phone ex114 that uses the moving picture coding method and the moving picture decoding method described in embodiments. The cellular phone ex114 includes: an antenna ex350 for transmitting and receiving radio waves through the base station ex110; a camera unit ex365 capable of capturing moving and still images; and a display unit ex358 such as a liquid crystal display for displaying the data such as decoded video captured by the camera unit ex365 or received by the antenna ex350. The cellular phone ex114 further includes: a main body unit including an operation key unit ex366; an audio output unit ex357 such as a speaker for output of audio; an audio input unit ex356 such as a microphone for input of audio; a memory unit ex367 for storing captured video or still pictures, recorded audio, encoded or decoded data of the received video, the still pictures, e-mails, or others; and a slot unit ex364 that is an interface unit for a recording medium that stores data in the same manner as the memory unit ex367.

Next, an example of a configuration of the cellular phone ex114 will be described with reference to (b) in FIG. 23. In the cellular phone ex114, a main control unit ex360 designed to control overall each unit of the main body including the display unit ex358 as well as the operation key unit ex366 is connected mutually, via a synchronous bus ex370, to a power supply circuit unit ex361, an operation input control unit ex362, a video signal processing unit ex355, a camera interface unit ex363, a liquid crystal display (LCD) control unit ex359, a modulation/demodulation unit ex352, a multiplexing/demultiplexing unit ex353, an audio signal processing unit ex354, the slot unit ex364, and the memory unit ex367.

When a call-end key or a power key is turned ON by a user's operation, the power supply circuit unit ex361 supplies the respective units with power from a battery pack so as to activate the cell phone ex114.

In the cellular phone ex114, the audio signal processing unit ex354 converts the audio signals collected by the audio input unit ex356 in voice conversation mode into digital audio signals under the control of the main control unit ex360 including a CPU, ROM, and RAM. Then, the modulation/demodulation unit ex352 performs spread spectrum processing on the digital audio signals, and the transmitting and receiving unit ex351 performs digital-to-analog conversion and frequency conversion on the data, so as to transmit the resulting data via the antenna ex350. Also, in the cellular phone ex114, the transmitting and receiving unit ex351 amplifies the data received by the antenna ex350 in voice conversation mode and performs frequency conversion and the analog-to-digital conversion on the data. Then, the modulation/demodulation unit ex352 performs inverse spread spectrum processing on the data, and the audio signal processing unit ex354 converts it into analog audio signals, so as to output them via the audio output unit ex357.

Furthermore, when an e-mail in data communication mode is transmitted, text data of the e-mail inputted by operating the operation key unit ex366 and others of the main body is sent out to the main control unit ex360 via the operation input control unit ex362. The main control unit ex360 causes the modulation/demodulation unit ex352 to perform spread spectrum processing on the text data, and the transmitting and receiving unit ex351 performs the digital-to-analog conversion and the frequency conversion on the resulting data to transmit the data to the base station ex110 via the antenna ex350. When an e-mail is received, processing that is approximately inverse to the processing for transmitting an e-mail is performed on the received data, and the resulting data is provided to the display unit ex358.

When video, still images, or video and audio in data communication mode is or are transmitted, the video signal processing unit ex355 compresses and codes video signals supplied from the camera unit ex365 using the moving picture coding method shown in each of embodiments (i.e., functions as the image coding apparatus according to the aspect of the present invention), and transmits the coded video data to the multiplexing/demultiplexing unit ex353. In contrast, during when the camera unit ex365 captures video, still images, and others, the audio signal processing unit ex354 codes audio signals collected by the audio input unit ex356, and transmits the coded audio data to the multiplexing/demultiplexing unit ex353.

The multiplexing/demultiplexing unit ex353 multiplexes the coded video data supplied from the video signal processing unit ex355 and the coded audio data supplied from the audio signal processing unit ex354, using a predetermined method. Then, the modulation/demodulation unit (modulation/demodulation circuit unit) ex352 performs spread spectrum processing on the multiplexed data, and the transmitting and receiving unit ex351 performs digital-to-analog conversion and frequency conversion on the data so as to transmit the resulting data via the antenna ex350.

When receiving data of a video file which is linked to a Web page and others in data communication mode or when receiving an e-mail with video and/or audio attached, in order to decode the multiplexed data received via the antenna ex350, the multiplexing/demultiplexing unit ex353 demultiplexes the multiplexed data into a video data bit stream and an audio data bit stream, and supplies the video signal processing unit ex355 with the coded video data and the audio signal processing unit ex354 with the coded audio data, through the synchronous bus ex370. The video signal processing unit ex355 decodes the video signal using a moving picture decoding method corresponding to the moving picture coding method shown in each of embodiments (i.e., functions as the image decoding apparatus according to the aspect of the present invention), and then the display unit ex358 displays, for instance, the video and still images included in the video file linked to the Web page via the LCD control unit ex359. Furthermore, the audio signal processing unit ex354 decodes the audio signal, and the audio output unit ex357 provides the audio.

Furthermore, similarly to the television ex300, a terminal such as the cellular phone ex114 probably have 3 types of implementation configurations including not only (i) a transmitting and receiving terminal including both a coding apparatus and a decoding apparatus, but also (ii) a transmitting terminal including only a coding apparatus and (iii) a receiving terminal including only a decoding apparatus. Although the digital broadcasting system ex200 receives and transmits the multiplexed data obtained by multiplexing audio data onto video data in the description, the multiplexed data may be data obtained by multiplexing not audio data but character data related to video onto video data, and may be not multiplexed data but video data itself.

As such, the moving picture coding method and the moving picture decoding method in each of embodiments can be used in any of the devices and systems described. Thus, the advantages described in each of embodiments can be obtained.

Furthermore, the present invention is not limited to embodiments, and various modifications and revisions are possible without departing from the scope of the present invention.

Embodiment 5

Video data can be generated by switching, as necessary, between (i) the moving picture coding method or the moving picture coding apparatus shown in each of embodiments and (ii) a moving picture coding method or a moving picture coding apparatus in conformity with a different standard, such as MPEG-2, MPEG-4 AVC, and VC-1.

Here, when a plurality of video data that conforms to the different standards is generated and is then decoded, the decoding methods need to be selected to conform to the different standards. However, since to which standard each of the plurality of the video data to be decoded conform cannot be detected, there is a problem that an appropriate decoding method cannot be selected.

In order to solve the problem, multiplexed data obtained by multiplexing audio data and others onto video data has a structure including identification information indicating to which standard the video data conforms. The specific structure of the multiplexed data including the video data generated in the moving picture coding method and by the moving picture coding apparatus shown in each of embodiments will be hereinafter described. The multiplexed data is a digital stream in the MPEG-2 Transport Stream format.

FIG. 24 illustrates a structure of the multiplexed data. As illustrated in FIG. 24, the multiplexed data can be obtained by multiplexing at least one of a video stream, an audio stream, a presentation graphics stream (PG), and an interactive graphics stream. The video stream represents primary video and secondary video of a movie, the audio stream (IG) represents a primary audio part and a secondary audio part to be mixed with the primary audio part, and the presentation graphics stream represents subtitles of the movie. Here, the primary video is normal video to be displayed on a screen, and the secondary video is video to be displayed on a smaller window in the primary video. Furthermore, the interactive graphics stream represents an interactive screen to be generated by arranging the GUI components on a screen. The video stream is coded in the moving picture coding method or by the moving picture coding apparatus shown in each of embodiments, or in a moving picture coding method or by a moving picture coding apparatus in conformity with a conventional standard, such as MPEG-2, MPEG-4 AVC, and VC-1. The audio stream is coded in accordance with a standard, such as Dolby-AC-3, Dolby Digital Plus, MLP, DTS, DTS-HD, and linear PCM.

Each stream included in the multiplexed data is identified by PID. For example, 0x1011 is allocated to the video stream to be used for video of a movie, 0x1100 to 0x111F are allocated to the audio streams, 0x1200 to 0x121F are allocated to the presentation graphics streams, 0x1400 to 0x141F are allocated to the interactive graphics streams, 0x1B00 to 0x1B1F are allocated to the video streams to be used for secondary video of the movie, and 0x1A00 to 0x1A1F are allocated to the audio streams to be used for the secondary audio to be mixed with the primary audio.

FIG. 25 schematically illustrates how data is multiplexed. First, a video stream ex235 composed of video frames and an audio stream ex238 composed of audio frames are transformed into a stream of PES packets ex236 and a stream of PES packets ex239, and further into TS packets ex237 and TS packets ex240, respectively. Similarly, data of a presentation graphics stream ex241 and data of an interactive graphics stream ex244 are transformed into a stream of PES packets ex242 and a stream of PES packets ex245, and further into TS packets ex243 and TS packets ex246, respectively. These TS packets are multiplexed into a stream to obtain multiplexed data ex247.

FIG. 26 illustrates how a video stream is stored in a stream of PES packets in more detail. The first bar in FIG. 26 shows a video frame stream in a video stream. The second bar shows the stream of PES packets. As indicated by arrows denoted as yy1, yy2, yy3, and yy4 in FIG. 31, the video stream is divided into pictures as I pictures, B pictures, and P pictures each of which is a video presentation unit, and the pictures are stored in a payload of each of the PES packets. Each of the PES packets has a PES header, and the PES header stores a Presentation Time-Stamp (PTS) indicating a display time of the picture, and a Decoding Time-Stamp (DTS) indicating a decoding time of the picture.

FIG. 27 illustrates a format of TS packets to be lastly written on the multiplexed data. Each of the TS packets is a 188-byte fixed length packet including a 4-byte TS header having information, such as a PID for identifying a stream and a 184-byte TS payload for storing data. The PES packets are divided, and stored in the TS payloads, respectively. When a BD ROM is used, each of the TS packets is given a 4-byte TP_Extra_Header, thus resulting in 192-byte source packets. The source packets are written on the multiplexed data. The TP_Extra_Header stores information such as an Arrival_Time_Stamp (ATS). The ATS shows a transfer start time at which each of the TS packets is to be transferred to a PID filter. The source packets are arranged in the multiplexed data as shown at the bottom of FIG. 27. The numbers incrementing from the head of the multiplexed data are called source packet numbers (SPNs).

Each of the TS packets included in the multiplexed data includes not only streams of audio, video, subtitles and others, but also a Program Association Table (PAT), a Program Map Table (PMT), and a Program Clock Reference (PCR). The PAT shows what a PID in a PMT used in the multiplexed data indicates, and a PID of the PAT itself is registered as zero. The PMT stores PIDs of the streams of video, audio, subtitles and others included in the multiplexed data, and attribute information of the streams corresponding to the PIDs. The PMT also has various descriptors relating to the multiplexed data. The descriptors have information such as copy control information showing whether copying of the multiplexed data is permitted or not. The PCR stores STC time information corresponding to an ATS showing when the PCR packet is transferred to a decoder, in order to achieve synchronization between an Arrival Time Clock (ATC) that is a time axis of ATSs, and an System Time Clock (STC) that is a time axis of PTSs and DTSs.

FIG. 28 illustrates the data structure of the PMT in detail. A PMT header is disposed at the top of the PMT. The PMT header describes the length of data included in the PMT and others. A plurality of descriptors relating to the multiplexed data is disposed after the PMT header. Information such as the copy control information is described in the descriptors. After the descriptors, a plurality of pieces of stream information relating to the streams included in the multiplexed data is disposed. Each piece of stream information includes stream descriptors each describing information, such as a stream type for identifying a compression codec of a stream, a stream PID, and stream attribute information (such as a frame rate or an aspect ratio). The stream descriptors are equal in number to the number of streams in the multiplexed data.

When the multiplexed data is recorded on a recording medium and others, it is recorded together with multiplexed data information files.

Each of the multiplexed data information files is management information of the multiplexed data as shown in FIG. 29. The multiplexed data information files are in one to one correspondence with the multiplexed data, and each of the files includes multiplexed data information, stream attribute information, and an entry map.

As illustrated in FIG. 29, the multiplexed data information includes a system rate, a reproduction start time, and a reproduction end time. The system rate indicates the maximum transfer rate at which a system target decoder to be described later transfers the multiplexed data to a PID filter. The intervals of the ATSs included in the multiplexed data are set to not higher than a system rate. The reproduction start time indicates a PTS in a video frame at the head of the multiplexed data. An interval of one frame is added to a PTS in a video frame at the end of the multiplexed data, and the PTS is set to the reproduction end time.

As shown in FIG. 30, a piece of attribute information is registered in the stream attribute information, for each PID of each stream included in the multiplexed data. Each piece of attribute information has different information depending on whether the corresponding stream is a video stream, an audio stream, a presentation graphics stream, or an interactive graphics stream. Each piece of video stream attribute information carries information including what kind of compression codec is used for compressing the video stream, and the resolution, aspect ratio and frame rate of the pieces of picture data that is included in the video stream. Each piece of audio stream attribute information carries information including what kind of compression codec is used for compressing the audio stream, how many channels are included in the audio stream, which language the audio stream supports, and how high the sampling frequency is. The video stream attribute information and the audio stream attribute information are used for initialization of a decoder before the player plays back the information.

In the present embodiment, the multiplexed data to be used is of a stream type included in the PMT. Furthermore, when the multiplexed data is recorded on a recording medium, the video stream attribute information included in the multiplexed data information is used. More specifically, the moving picture coding method or the moving picture coding apparatus described in each of embodiments includes a step or a unit for allocating unique information indicating video data generated by the moving picture coding method or the moving picture coding apparatus in each of embodiments, to the stream type included in the PMT or the video stream attribute information. With the configuration, the video data generated by the moving picture coding method or the moving picture coding apparatus described in each of embodiments can be distinguished from video data that conforms to another standard.

Furthermore, FIG. 31 illustrates steps of the moving picture decoding method according to the present embodiment. In Step exS100, the stream type included in the PMT or the video stream attribute information included in the multiplexed data information is obtained from the multiplexed data. Next, in Step exS101, it is determined whether or not the stream type or the video stream attribute information indicates that the multiplexed data is generated by the moving picture coding method or the moving picture coding apparatus in each of embodiments. When it is determined that the stream type or the video stream attribute information indicates that the multiplexed data is generated by the moving picture coding method or the moving picture coding apparatus in each of embodiments, in Step exS102, decoding is performed by the moving picture decoding method in each of embodiments. Furthermore, when the stream type or the video stream attribute information indicates conformance to the conventional standards, such as MPEG-2, MPEG-4 AVC, and VC-1, in Step exS103, decoding is performed by a moving picture decoding method in conformity with the conventional standards.

As such, allocating a new unique value to the stream type or the video stream attribute information enables determination whether or not the moving picture decoding method or the moving picture decoding apparatus that is described in each of embodiments can perform decoding. Even when multiplexed data that conforms to a different standard is input, an appropriate decoding method or apparatus can be selected. Thus, it becomes possible to decode information without any error. Furthermore, the moving picture coding method or apparatus, or the moving picture decoding method or apparatus in the present embodiment can be used in the devices and systems described above.

Embodiment 6

Each of the moving picture coding method, the moving picture coding apparatus, the moving picture decoding method, and the moving picture decoding apparatus in each of embodiments is typically achieved in the form of an integrated circuit or a Large Scale Integrated (LSI) circuit. As an example of the LSI, FIG. 32 illustrates a configuration of the LSI ex500 that is made into one chip. The LSI ex500 includes elements ex501, ex502, ex503, ex504, ex505, ex506, ex507, ex508, and ex509 to be described below, and the elements are connected to each other through a bus ex510. The power supply circuit unit ex505 is activated by supplying each of the elements with power when the power supply circuit unit ex505 is turned on.

For example, when coding is performed, the LSI ex500 receives an AV signal from a microphone ex117, a camera ex113, and others through an AV IO ex509 under control of a control unit ex501 including a CPU ex502, a memory controller ex503, a stream controller ex504, and a driving frequency control unit ex512. The received AV signal is temporarily stored in an external memory ex511, such as an SDRAM. Under control of the control unit ex501, the stored data is segmented into data portions according to the processing amount and speed to be transmitted to a signal processing unit ex507. Then, the signal processing unit ex507 codes an audio signal and/or a video signal. Here, the coding of the video signal is the coding described in each of embodiments. Furthermore, the signal processing unit ex507 sometimes multiplexes the coded audio data and the coded video data, and a stream IO ex506 provides the multiplexed data outside. The provided multiplexed data is transmitted to the base station ex107, or written on the recording medium ex215. When data sets are multiplexed, the data should be temporarily stored in the buffer ex508 so that the data sets are synchronized with each other.

Although the memory ex511 is an element outside the LSI ex500, it may be included in the LSI ex500. The buffer ex508 is not limited to one buffer, but may be composed of buffers. Furthermore, the LSI ex500 may be made into one chip or a plurality of chips.

Furthermore, although the control unit ex501 includes the CPU ex502, the memory controller ex503, the stream controller ex504, the driving frequency control unit ex512, the configuration of the control unit ex501 is not limited to such. For example, the signal processing unit ex507 may further include a CPU. Inclusion of another CPU in the signal processing unit ex507 can improve the processing speed. Furthermore, as another example, the CPU ex502 may serve as or be a part of the signal processing unit ex507, and, for example, may include an audio signal processing unit. In such a case, the control unit ex501 includes the signal processing unit ex507 or the CPU ex502 including a part of the signal processing unit ex507.

The name used here is LSI, but it may also be called IC, system LSI, super LSI, or ultra LSI depending on the degree of integration.

Moreover, ways to achieve integration are not limited to the LSI, and a special circuit or a general purpose processor and so forth can also achieve the integration. Field Programmable Gate Array (FPGA) that can be programmed after manufacturing LSIs or a reconfigurable processor that allows re-configuration of the connection or configuration of an LSI can be used for the same purpose.

In the future, with advancement in semiconductor technology, a brand-new technology may replace LSI. The functional blocks can be integrated using such a technology. The possibility is that the present invention is applied to biotechnology.

Embodiment 7

When video data generated in the moving picture coding method or by the moving picture coding apparatus described in each of embodiments is decoded, compared to when video data that conforms to a conventional standard, such as MPEG-2, MPEG-4 AVC, and VC-1 is decoded, the processing amount probably increases. Thus, the LSI ex500 needs to be set to a driving frequency higher than that of the CPU ex502 to be used when video data in conformity with the conventional standard is decoded. However, when the driving frequency is set higher, there is a problem that the power consumption increases.

In order to solve the problem, the moving picture decoding apparatus, such as the television ex300 and the LSI ex500 is configured to determine to which standard the video data conforms, and switch between the driving frequencies according to the determined standard. FIG. 33 illustrates a configuration ex800 in the present embodiment. A driving frequency switching unit ex803 sets a driving frequency to a higher driving frequency when video data is generated by the moving picture coding method or the moving picture coding apparatus described in each of embodiments. Then, the driving frequency switching unit ex803 instructs a decoding processing unit ex801 that executes the moving picture decoding method described in each of embodiments to decode the video data. When the video data conforms to the conventional standard, the driving frequency switching unit ex803 sets a driving frequency to a lower driving frequency than that of the video data generated by the moving picture coding method or the moving picture coding apparatus described in each of embodiments. Then, the driving frequency switching unit ex803 instructs the decoding processing unit ex802 that conforms to the conventional standard to decode the video data.

More specifically, the driving frequency switching unit ex803 includes the CPU ex502 and the driving frequency control unit ex512 in FIG. 32. Here, each of the decoding processing unit ex801 that executes the moving picture decoding method described in each of embodiments and the decoding processing unit ex802 that conforms to the conventional standard corresponds to the signal processing unit ex507 in FIG. 32. The CPU ex502 determines to which standard the video data conforms. Then, the driving frequency control unit ex512 determines a driving frequency based on a signal from the CPU ex502. Furthermore, the signal processing unit ex507 decodes the video data based on the signal from the CPU ex502. For example, the identification information described in Embodiment 5 is probably used for identifying the video data. The identification information is not limited to the one described in Embodiment 5 but may be any information as long as the information indicates to which standard the video data conforms. For example, when which standard video data conforms to can be determined based on an external signal for determining that the video data is used for a television or a disk, etc., the determination may be made based on such an external signal. Furthermore, the CPU ex502 selects a driving frequency based on, for example, a look-up table in which the standards of the video data are associated with the driving frequencies as shown in FIG. 35. The driving frequency can be selected by storing the look-up table in the buffer ex508 and in an internal memory of an LSI, and with reference to the look-up table by the CPU ex502.

FIG. 34 illustrates steps for executing a method in the present embodiment. First, in Step exS200, the signal processing unit ex507 obtains identification information from the multiplexed data. Next, in Step exS201, the CPU ex502 determines whether or not the video data is generated by the coding method and the coding apparatus described in each of embodiments, based on the identification information. When the video data is generated by the moving picture coding method and the moving picture coding apparatus described in each of embodiments, in Step exS202, the CPU ex502 transmits a signal for setting the driving frequency to a higher driving frequency to the driving frequency control unit ex512. Then, the driving frequency control unit ex512 sets the driving frequency to the higher driving frequency. On the other hand, when the identification information indicates that the video data conforms to the conventional standard, such as MPEG-2, MPEG-4 AVC, and VC-1, in Step exS203, the CPU ex502 transmits a signal for setting the driving frequency to a lower driving frequency to the driving frequency control unit ex512. Then, the driving frequency control unit ex512 sets the driving frequency to the lower driving frequency than that in the case where the video data is generated by the moving picture coding method and the moving picture coding apparatus described in each of embodiment.

Furthermore, along with the switching of the driving frequencies, the power conservation effect can be improved by changing the voltage to be applied to the LSI ex500 or an apparatus including the LSI ex500. For example, when the driving frequency is set lower, the voltage to be applied to the LSI ex500 or the apparatus including the LSI ex500 is probably set to a voltage lower than that in the case where the driving frequency is set higher.

Furthermore, when the processing amount for decoding is larger, the driving frequency may be set higher, and when the processing amount for decoding is smaller, the driving frequency may be set lower as the method for setting the driving frequency. Thus, the setting method is not limited to the ones described above. For example, when the processing amount for decoding video data in conformity with MPEG-4 AVC is larger than the processing amount for decoding video data generated by the moving picture coding method and the moving picture coding apparatus described in each of embodiments, the driving frequency is probably set in reverse order to the setting described above.

Furthermore, the method for setting the driving frequency is not limited to the method for setting the driving frequency lower. For example, when the identification information indicates that the video data is generated by the moving picture coding method and the moving picture coding apparatus described in each of embodiments, the voltage to be applied to the LSI ex500 or the apparatus including the LSI ex500 is probably set higher. When the identification information indicates that the video data conforms to the conventional standard, such as MPEG-2, MPEG-4 AVC, and VC-1, the voltage to be applied to the LSI ex500 or the apparatus including the LSI ex500 is probably set lower. As another example, when the identification information indicates that the video data is generated by the moving picture coding method and the moving picture coding apparatus described in each of embodiments, the driving of the CPU ex502 does not probably have to be suspended. When the identification information indicates that the video data conforms to the conventional standard, such as MPEG-2, MPEG-4 AVC, and VC-1, the driving of the CPU ex502 is probably suspended at a given time because the CPU ex502 has extra processing capacity. Even when the identification information indicates that the video data is generated by the moving picture coding method and the moving picture coding apparatus described in each of embodiments, in the case where the CPU ex502 has extra processing capacity, the driving of the CPU ex502 is probably suspended at a given time. In such a case, the suspending time is probably set shorter than that in the case where when the identification information indicates that the video data conforms to the conventional standard, such as MPEG-2, MPEG-4 AVC, and VC-1.

Accordingly, the power conservation effect can be improved by switching between the driving frequencies in accordance with the standard to which the video data conforms. Furthermore, when the LSI ex500 or the apparatus including the LSI ex500 is driven using a battery, the battery life can be extended with the power conservation effect.

Embodiment 8

There are cases where a plurality of video data that conforms to different standards, is provided to the devices and systems, such as a television and a cellular phone. In order to enable decoding the plurality of video data that conforms to the different standards, the signal processing unit ex507 of the LSI ex500 needs to conform to the different standards. However, the problems of increase in the scale of the circuit of the LSI ex500 and increase in the cost arise with the individual use of the signal processing units ex507 that conform to the respective standards.

In order to solve the problem, what is conceived is a configuration in which the decoding processing unit for implementing the moving picture decoding method described in each of embodiments and the decoding processing unit that conforms to the conventional standard, such as MPEG-2, MPEG-4 AVC, and VC-1 are partly shared. Ex900 in (a) in FIG. 36 shows an example of the configuration. For example, the moving picture decoding method described in each of embodiments and the moving picture decoding method that conforms to MPEG-4 AVC have, partly in common, the details of processing, such as entropy coding, inverse quantization, deblocking filtering, and motion compensated prediction. The details of processing to be shared probably include use of a decoding processing unit ex902 that conforms to MPEG-4 AVC. In contrast, a dedicated decoding processing unit ex901 is probably used for other processing which is unique to an aspect of the present invention and does not conform to MPEG-4 AVC. Since the aspect of the present invention is characterized by inverse quantization in particular, for example, the dedicated decoding processing unit ex901 is used for inverse quantization. Otherwise, the decoding processing unit is probably shared for one of the entropy decoding, deblocking filtering, and motion compensation, or all of the processing. The decoding processing unit for implementing the moving picture decoding method described in each of embodiments may be shared for the processing to be shared, and a dedicated decoding processing unit may be used for processing unique to that of MPEG-4 AVC.

Furthermore, ex1000 in (b) in FIG. 36 shows another example in that processing is partly shared. This example uses a configuration including a dedicated decoding processing unit ex1001 that supports the processing unique to an aspect of the present invention, a dedicated decoding processing unit ex1002 that supports the processing unique to another conventional standard, and a decoding processing unit ex1003 that supports processing to be shared between the moving picture decoding method according to the aspect of the present invention and the conventional moving picture decoding method. Here, the dedicated decoding processing units ex1001 and ex1002 are not necessarily specialized for the processing according to the aspect of the present invention and the processing of the conventional standard, respectively, and may be the ones capable of implementing general processing. Furthermore, the configuration of the present embodiment can be implemented by the LSI ex500.

As such, reducing the scale of the circuit of an LSI and reducing the cost are possible by sharing the decoding processing unit for the processing to be shared between the moving picture decoding method according to the aspect of the present invention and the moving picture decoding method in conformity with the conventional standard.

INDUSTRIAL APPLICABILITY

The present invention is effectively used in image coding apparatuses and image decoding apparatuses.

REFERENCE SIGNS LIST 10, 100 Arithmetic coding unit
11, 101 Binarization unit
12, 102, 302 Symbol occurrence probability storage unit
13, 103, 303 Context control unit
14, 104 Binary arithmetic coder
105, 305 Context segment control unit
200 Image coding apparatus
205 Subtractor
210 Transformation and quantization unit
220 Entropy coding unit
230, 420 Inverse quantization and inverse transformation unit
235, 425 Adder
240, 430 Deblocking filter
250, 440 Memory
260, 450 Intra prediction unit
270 Motion estimation unit
280, 460 Motion compensation unit
290, 470 Intra-inter switch
300 Arithmetic decoding unit
301 Binary arithmetic decoder
304 Multivalue unit
400 Image decoding apparatus
410 Entropy decoding unit

The invention claimed is:

1. An image decoding method for decoding coded image data on a block-by-block basis, the image decoding method comprising:
  segmenting a block including a current signal to be decoded that is part of the coded image data, into a first plurality of groups, a second plurality of groups, and a third plurality of groups according to a type of the current signal, wherein each of the groups in the first plurality of groups, each of the groups in the second plurality of groups, and each of the groups in the third plurality of groups corresponds to a different frequency component range;
  determining a context corresponding to each of the groups in the first plurality of groups to generate a first set of mapping information, determining a context corresponding to each of the groups in the second plurality of groups to generate a second set of mapping information, and determining a context corresponding to each of the groups in the third plurality of groups to generate a third set of mapping information, wherein the first set of mapping information indicates a correspondence between each of the groups in the first plurality of groups and a corresponding context, the second set of mapping information indicates a correspondence between each of the groups in the second plurality of groups and a corresponding context, and the third set of mapping information indicates a correspondence between each of the groups in the third plurality of groups and a corresponding context;
  receiving, from the coded image data, an identifier which identifies one of (i) the first set of mapping information, (ii) the second set of mapping information, or (iii) the third set of mapping information;
  performing binary arithmetic decoding on the current signal according to a probability information item corresponding to a context indicated by the received identifier, to generate binarized coefficients, the context corresponding to the group having the current signal; and
  updating, for each of probability information items, the probability information item corresponding to the context, based on the coefficient included in the group corresponding to the context, wherein in the segmenting, the block is segmented into the first plurality of groups, the second plurality of groups, and the third plurality of groups such that the number of the groups in each of the first plurality of groups, the second plurality of groups, and the third plurality of groups is respectively different.

2. The image decoding method according to claim 1, wherein at least one of the coefficients includes a first flag and a second flag, the first flag indicating whether or not a corresponding quantized coefficient is zero, the second flag indicating a position of a last non-zero quantized coefficient in scan order.

3. An image decoding apparatus which decodes coded image data on a block-by-block basis, the image decoding apparatus comprising:
a context determination unit configured to:
segment a block including a current signal to be decoded that is part of the coded image data, into a first plurality of groups, a second plurality of groups, and a third plurality of groups according to a type of the current signal, wherein each of the groups in the first plurality of groups, each of the groups in the second plurality of groups, and each of the groups in the third plurality of groups corresponds to a different frequency component range; and
determine a context corresponding to each of the groups in the first plurality of groups to generate a first set of mapping information, determine a context corresponding to each of the groups in the second plurality of groups to generate a second set of mapping information, and determine a context corresponding to each of the groups in the third plurality of groups to generate a third set of mapping information, wherein the first set of mapping information indicates a correspondence between each of the groups in the first plurality of groups and a corresponding context, the second set of mapping information indicates a correspondence between each of the groups in the second plurality of groups and a corresponding context, and the third set of mapping information indicates a correspondence between each of the groups in the third plurality of groups and a corresponding context;
a receiving unit configured to receive, from the coded image data, an identifier which identifies one of (i) the first set of mapping information, (ii) the second set of mapping information, or (iii) the third set of mapping information;
a binary arithmetic decoding unit configured to perform binary arithmetic decoding on the current signal according to a probability information item corresponding to a context indicated by the received identifier, to generate binarized coefficients, the context corresponding to the group having the current signal; and
an updating unit configured to update, for each of probability information items, the probability information item corresponding to the context, based on the coefficient included in the group corresponding to the context,
wherein the context determination unit is configured to segment the block into the first plurality of groups, the second plurality of groups, and the third plurality of groups such that the number of the groups in each of the first plurality of groups, the second plurality of groups, and the third plurality of groups is respectively different.

4. An image decoding method for decoding coded image data on a block-by-block basis, the image decoding method comprising:
segmenting a block including a current signal to be decoded that is part of the coded image data, into a first plurality of groups and a second plurality of groups according to a type of the current signal, wherein each of the groups in the first plurality of groups and each of the groups in the second plurality of groups corresponds to a different frequency component range;
determining a context corresponding to each of the groups in the first plurality of groups to generate a first set of mapping information, and determining a context corresponding to each of the groups in the second plurality of groups to generate a second set of mapping information, wherein the first set of mapping information indicates a correspondence between each of the groups in the first plurality of groups and a corresponding context, and the second set of mapping information indicates a correspondence between each of the groups in the second plurality of groups and a corresponding context;
receiving, from the coded image data, an identifier which identifies one of (i) the first set of mapping information or (ii) the second set of mapping information;
performing binary arithmetic decoding on the current signal according to a probability information item corresponding to a context indicated by the received identifier, to generate binarized coefficients, the context corresponding to the group having the current signal; and
updating, for each of probability information items, the probability information item corresponding to the context, based on the coefficient included in the group corresponding to the context,
wherein in the segmenting, the block is segmented into the first plurality of groups and the second plurality of groups such that the number of the groups in each of the first plurality of groups and the second plurality of groups is respectively different.

5. An image decoding apparatus which decodes coded image data on a block-by-block basis, the image decoding apparatus comprising:
a context determination unit configured to:
segment a block including a current signal to be decoded that is part of the coded image data, into a first plurality of groups and a second plurality of groups according to a type of the current signal, wherein each of the groups in the first plurality of groups and each of the groups in the second plurality of groups corresponds to a different frequency component range; and
determine a context corresponding to each of the groups in the first plurality of groups to generate a first set of mapping information, and determine a context corresponding to each of the groups in the second plurality of groups to generate a second set of mapping information, wherein the first set of mapping information indicates a correspondence between each of the groups in the first plurality of groups and a corresponding context, and the second set of mapping information indicates a correspondence between each of the groups in the second plurality of groups and a corresponding context;

a receiving unit configured to receive, from the coded image data, an identifier which identifies one of (i) the first set of mapping information or (ii) the second set of mapping information;

a binary arithmetic decoding unit configured to perform binary arithmetic decoding on the current signal according to a probability information item corresponding to a context indicated by the received identifier, to generate binarized coefficients, the context corresponding to the group having the current signal; and an updating unit configured to update, for each of probability information items, the probability information item corresponding to the context, based on the coefficient included in the group corresponding to the context, wherein the context determination unit is configured to segment the block into the first plurality of groups and the second plurality of groups such that the number of the groups in each of the first plurality of groups and the second plurality of groups is respectively different.

\* \* \* \* \*